(12) United States Patent
Beer et al.

(10) Patent No.: US 9,818,730 B2
(45) Date of Patent: *Nov. 14, 2017

(54) SEMICONDUCTOR ARRANGEMENT, METHOD FOR PRODUCING A NUMBER OF CHIP ASSEMBLIES, METHOD FOR PRODUCING A SEMICONDUCTOR ARRANGEMENT AND METHOD FOR OPERATING A SEMICONDUCTOR ARRANGEMENT

(71) Applicant: Infineon Technologies AG, Neubiberg (DE)

(72) Inventors: Gottfried Beer, Nittendorf (DE); Irmgard Escher-Poeppel, Duggendorf (DE); Juergen Hoegerl, Regensburg (DE); Olaf Hohlfeld, Warstein (DE); Peter Kanschat, Soest (DE)

(73) Assignee: Infineon Technologies AG, Neubiberg (DE)

( * ) Notice: Subject to any disclaimer, the term of this patent is extended or adjusted under 35 U.S.C. 154(b) by 197 days.

This patent is subject to a terminal disclaimer.

(21) Appl. No.: 14/477,386

(22) Filed: Sep. 4, 2014

(65) Prior Publication Data

US 2015/0061100 A1 Mar. 5, 2015

(30) Foreign Application Priority Data

Sep. 5, 2013 (DE) .......................... 10 2013 217 801

(51) Int. Cl.
*H01L 23/48* (2006.01)
*H01L 25/07* (2006.01)
(Continued)

(52) U.S. Cl.
CPC .......... *H01L 25/072* (2013.01); *H01L 21/561* (2013.01); *H01L 21/566* (2013.01);
(Continued)

(58) Field of Classification Search
CPC .............................. H01L 21/561; H01L 23/48
(Continued)

(56) References Cited

U.S. PATENT DOCUMENTS 6,281,569 B1 * 8/2001 Sugiyama ............... H01L 24/72
257/688
7,538,436 B2 * 5/2009 Gunturi ................. H01L 23/051
257/773
(Continued)

FOREIGN PATENT DOCUMENTS

DE 102012202281 A1 8/2013
DE 102013216709 A1 2/2015

*Primary Examiner* — Jamie C Niesz
(74) *Attorney, Agent, or Firm* — Murphy, Bilak & Homiller, PLLC

(57) ABSTRACT

A semiconductor arrangement includes top and bottom contact plates, a plurality of chip assemblies, a dielectric embedding compound, and a control electrode interconnection structure. Each chip assembly has a semiconductor chip having a semiconductor body. The semiconductor body has a top side and an opposing underside. The top side is spaced apart from the underside in a vertical direction. Each semiconductor chip has a top main electrode arranged on the top side, a bottom main electrode arranged on the underside, a control electrode arranged at the top side, and an electrically conductive top compensation die, arranged on the side of the top main electrode facing away from the semiconductor body and cohesively and electrically conductively connected to the top main electrode by means of a top connecting layer. An electric current between the top main electrode and the bottom main electrode can be controlled by means of the control electrode.

28 Claims, 23 Drawing Sheets

(51) Int. Cl.
    *H01L 23/492*     (2006.01)
    *H01L 23/495*     (2006.01)
    *H01L 23/00*     (2006.01)
    *H01L 25/00*     (2006.01)
    *H01L 21/56*     (2006.01)
    *H01L 23/051*     (2006.01)
    *H01L 23/31*     (2006.01)

(52) U.S. Cl.
    CPC .......... *H01L 21/568* (2013.01); *H01L 23/051* (2013.01); *H01L 23/48* (2013.01); *H01L 23/492* (2013.01); *H01L 23/49562* (2013.01); *H01L 24/24* (2013.01); *H01L 24/33* (2013.01); *H01L 24/72* (2013.01); *H01L 24/82* (2013.01); *H01L 24/83* (2013.01); *H01L 24/96* (2013.01); *H01L 25/50* (2013.01); *H01L 23/3107* (2013.01); *H01L 23/562* (2013.01); *H01L 2224/03002* (2013.01); *H01L 2224/06181* (2013.01); *H01L 2224/24137* (2013.01); *H01L 2224/24195* (2013.01); *H01L 2224/29011* (2013.01); *H01L 2224/32245* (2013.01); *H01L 2224/82039* (2013.01); *H01L 2224/8384* (2013.01); *H01L 2224/8385* (2013.01); *H01L 2224/83801* (2013.01); *H01L 2224/96* (2013.01); *H01L 2924/12042* (2013.01); *H01L 2924/1301* (2013.01); *H01L 2924/1305* (2013.01); *H01L 2924/13055* (2013.01); *H01L 2924/13091* (2013.01); *H01L 2924/19041* (2013.01); *H01L 2924/19042* (2013.01); *H01L 2924/19043* (2013.01); *H01L 2924/19105* (2013.01); *H01L 2924/2064* (2013.01); *H01L 2924/20643* (2013.01); *H01L 2924/20644* (2013.01)

(58) Field of Classification Search
    USPC .................................................. 257/773, 676
    See application file for complete search history.

(56) References Cited

U.S. PATENT DOCUMENTS

| | | | |
|---|---|---|---|
| 9,589,859 | B2* | 3/2017 | Beer .................. H01L 21/56 |
| 2001/0011757 | A1* | 8/2001 | Miyake ............... H01L 23/051 |
| | | | 257/415 |
| 2016/0126212 | A1* | 5/2016 | Hohlfeld ............. H01L 24/72 |
| | | | 327/538 |

* cited by examiner

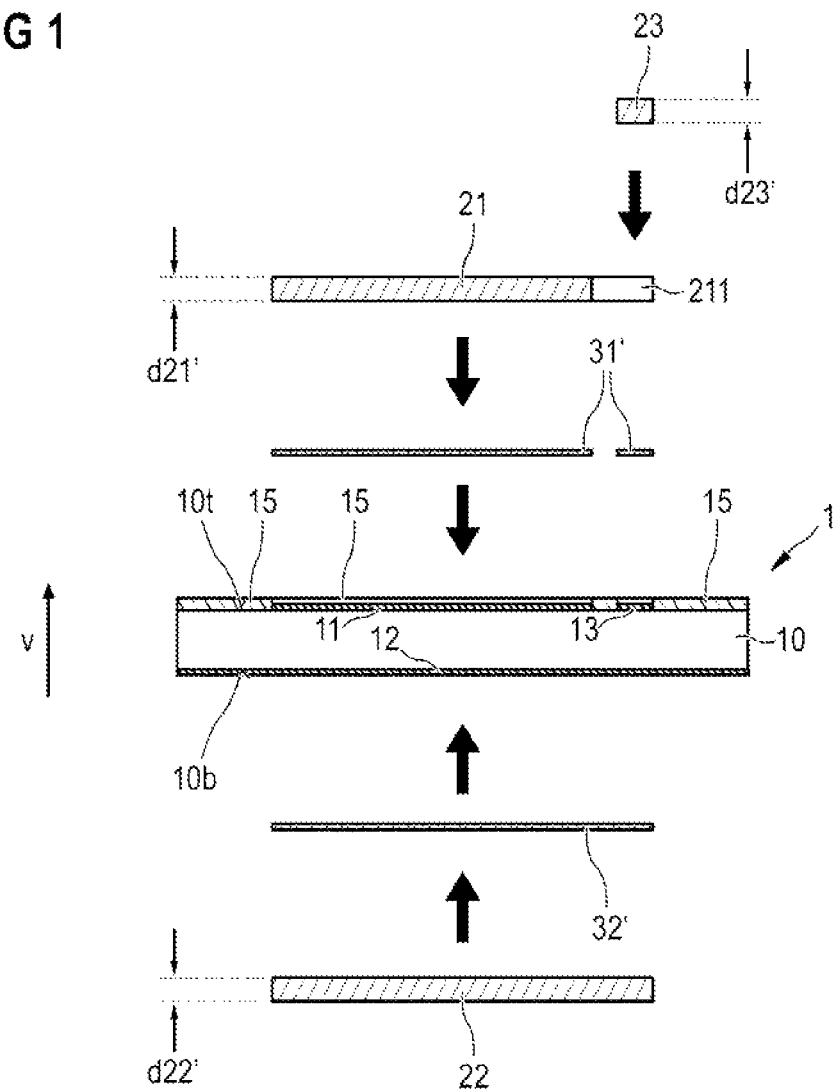
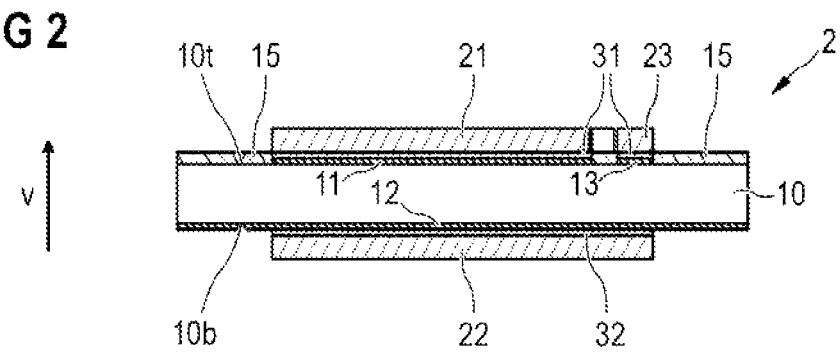

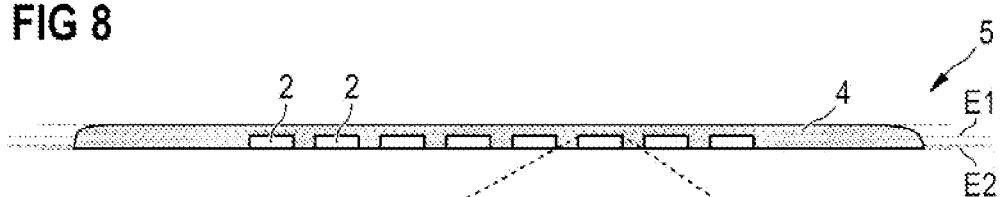
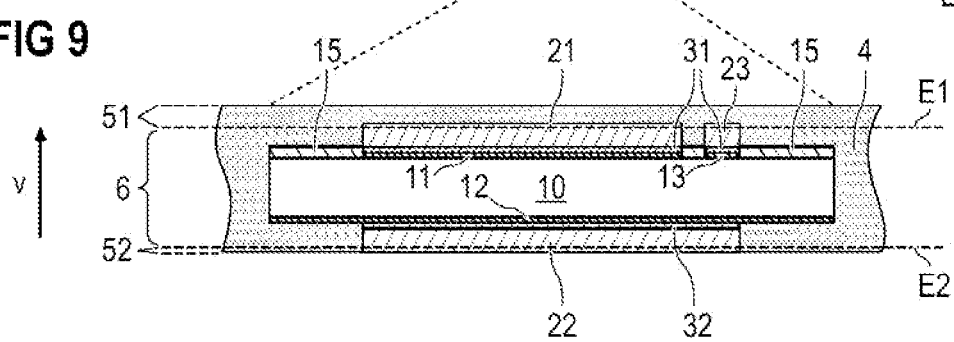
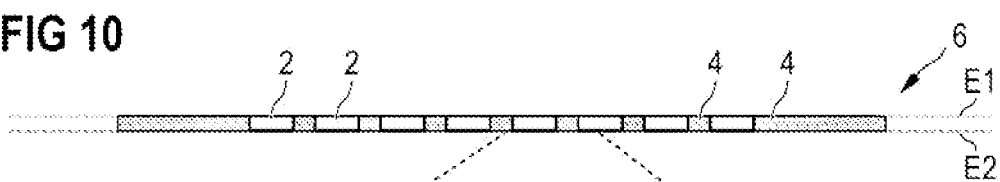
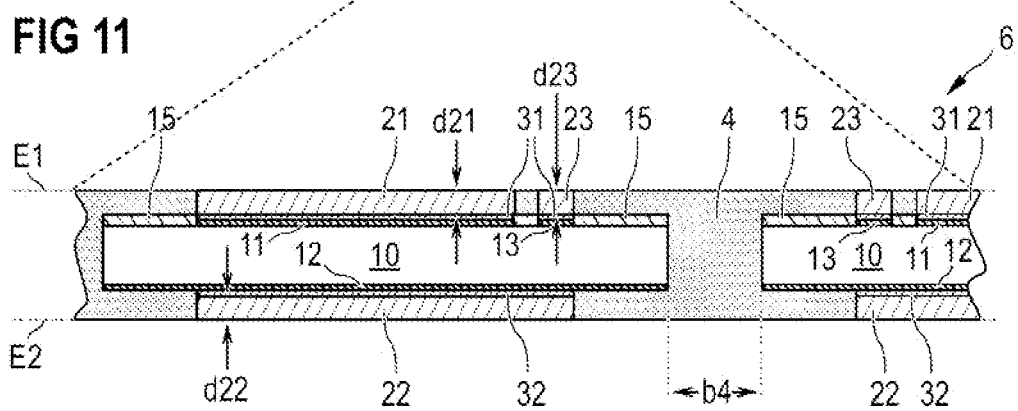

SEMICONDUCTOR ARRANGEMENT, METHOD FOR PRODUCING A NUMBER OF CHIP ASSEMBLIES, METHOD FOR PRODUCING A SEMICONDUCTOR ARRANGEMENT AND METHOD FOR OPERATING A SEMICONDUCTOR ARRANGEMENT

PRIORITY CLAIM

This application claims priority to German Patent Application No. 10 2013 217 801.8, filed on 5 Sep. 2013, the content of said German application incorporated herein by reference in its entirety.

BACKGROUND

Semiconductor arrangements comprising press pack cells that are currently commercially available have a complex construction in order that the semiconductor chips contained in the press pack cells are electrically connected to the terminal contacts of the cell, for example emitter and collector, source and drain or anode and cathode.

Therefore, there is a need for an improved design of such semiconductor arrangements, for an improved production method and operation of an improved semiconductor arrangement.

SUMMARY

A semiconductor arrangement comprises a top contact plate and a bottom contact plate, and a number of chip assemblies. Each of the chip assemblies has a semiconductor chip having a semiconductor body having a top side and an underside opposite the top side, a top main electrode arranged on the top side, and a bottom main electrode arranged on the underside, and a control electrode, which is arranged at the top side and by means of which an electric current between the top main electrode and the bottom main electrode can be controlled.

Main electrodes in this sense are understood to mean electrodes between which a load current flows through the semiconductor body during the operation of the semiconductor chip. The semiconductor chip can contain, for example, a diode, or a MOSFET, an IGBT, generally an IGFET, a bipolar transistor, a thyristor, or any other controllable power semiconductor component. The top and bottom main electrodes can generally be anode and cathode, cathode and anode, drain and source, source and drain, emitter and collector or collector and emitter of an arbitrary power semiconductor component integrated into the respective semiconductor chip. If the power semiconductor component is a controllable power semiconductor component, that is to say a power semiconductor component having a control terminal such as e.g. a gate terminal (e.g. MOSFET, IGBT, IGFET, thyristor) or a base terminal (e.g. bipolar transistor excluding IGBT), a control electrode is additionally present, which is situated at the top side.

Furthermore, each of the chip assemblies has an electrically conductive top compensation die, which is arranged on the side of the top main electrode facing away from the semiconductor body and is cohesively and electrically conductively connected to the top main electrode by means of a top connecting layer. The chip assemblies are material bonded to one another to form a solid composite by a dielectric embedding compound, wherein both the chip assemblies and the dielectric embedding compound are constituent parts of the composite. Here, in the case of each of the chip assemblies, that side of the top compensation die of the relevant chip assembly which faces away from the semiconductor body is not or at least not completely covered by the embedding compound.

An electrically conductive top compensation die is in each case arranged on the side of the top main electrode facing away from the semiconductor body and is cohesively and electrically conductively connected to the top main electrode by means of a top connecting layer. Correspondingly, an electrically conductive bottom compensation die is in each case arranged on the side of the bottom main electrode facing away from the semiconductor body and is cohesively and electrically conductively connected to the bottom main electrode by means of a bottom connecting layer. The cohesive connection prevents disturbing foreign bodies or other substances from passing between the main electrode and the compensation die material bonded thereto and prevents the main electrode and the semiconductor body from being damaged as a result. A control electrode interconnection structure is arranged on the solid composite, and electrically conductively connects the control electrodes of the chip assemblies to one another. Optionally, the embedding compound can directly adjoin the semiconductor body, i.e. the semiconductor material of the semiconductor body, and be material bonded to the semiconductor body. Each of the chip assemblies is arranged between the top contact plate and the bottom contact plate in such a way that in the case of this chip assembly the side of the top compensation die facing away from the semiconductor body makes electrical contact with the top contact plate.

A method for producing a semiconductor assembly involves providing a carrier, and a dielectric embedding compound and a number of chip assemblies. Each of said chip assemblies has a semiconductor chip having a semiconductor body, wherein the semiconductor body has a top side and an underside opposite the top side. Moreover, each of the chip assemblies contains a top main electrode arranged on the top side, a bottom main electrode arranged on the underside, a control electrode, which is arranged at the top side and by means of which an electric current between the top main electrode and the bottom main electrode can be controlled, and an electrically conductive top compensation die, which is arranged on the side of the top main electrode facing away from the semiconductor body and is cohesively and electrically conductively connected to said top main electrode by means of a top connecting layer. The chip assemblies are arranged alongside one another on the carrier and then embedded into the embedding compound and the embedding compound is then cured, such that the chip assemblies are fixedly connected to one another by the cured embedding compound and together with the embedding compound form a solid composite. A top cover layer is removed from this composite, such that from the composite a residual composite remains. In this case, when the top cover layer is removed, the cured embedding compound is partly removed from the original composite, and in the case of each of the chip assemblies the electrically conductive top compensation die of the relevant chip assemblies is partly removed from the original composite, such that the top compensation die is not or at least not completely covered by the embedding compound.

In the residual composite, the individual chip assemblies are held together exclusively by the cured embedding compound or additionally by the cured embedding compound. In this case, the cured embedding compound can be embodied as a continuous, integral structure. Independently thereof and likewise optionally, in the case of each of the chip assemblies the semiconductor bodies thereof (i.e. the semiconductor material) can directly adjoin the cured embedding compound and be material bonded thereto.

In the residual composite, the residue of the embedding compound encloses the semiconductor chip of each of the chip assemblies laterally circumferentially in a ring-shaped fashion in such a way that that side of the (part—which remained after the removal of the top cover layer—of the) top compensation die of this chip assembly which faces away from the semiconductor body is not or at least not completely covered by the embedding compound.

The control electrode interconnection structure is applied to the residual composite, and electrically conductively connects the control electrodes of the chip assemblies to one another.

Proceeding from a semiconductor assembly produced in this way, it is possible to produce a semiconductor arrangement having the features mentioned above. For this purpose, a top contact plate and a bottom contact plate are provided, and the semiconductor assembly is arranged between the top contact plate and the bottom contact plate in such a way that in the case of each of the chip assemblies the side of the top compensation die facing away from the semiconductor body makes electrical and mechanical contact with the top contact plate, and that the side of the bottom compensation die facing away from the semiconductor body makes electrical and mechanical contact with the bottom contact plate.

In order to enable the electrical operation of a semiconductor arrangement explained above, said semiconductor arrangement can be clamped in between an electrically conductive top pressure contact piece and an electrically conductive bottom pressure contact piece in such a way that there is a pressure contact between the top pressure contact piece and the top contact plate, without the top pressure contact piece and the top contact plate being cohesively connected, and that there is a pressure contact between the bottom pressure contact piece and the bottom contact plate, without the bottom pressure contact piece and the bottom contact plate being cohesively connected. The top pressure contact piece and the bottom pressure contact piece are connected to an electrical voltage source, such that different electrical potentials are present at the top pressure contact piece and the bottom pressure contact piece.

BRIEF DESCRIPTION OF THE DRAWINGS

The invention is explained below on the basis of exemplary embodiments with reference to the accompanying figures. In the figures, identical reference signs designate identical or identically acting parts. In the figures:

FIG. 1 shows a semiconductor chip with further parts for producing a chip assembly.

FIG. 2 shows the chip assembly produced from the semiconductor chip and the further parts in accordance with FIG. 1.

FIG. 8 shows the composite formed by the cured embedding compound and the semiconductor arrangements after the removal of the composite from the carrier.

FIG. 9 shows an enlarged portion of the composite in accordance with FIG. 8.

FIG. 10 shows the residual composite remaining after the removal of a top and a bottom cover layer from the composite shown in FIG. 8.

FIG. 11 shows an enlarged portion of the residual composite in accordance with FIG. 10.

DETAILED DESCRIPTION

Figure 3:
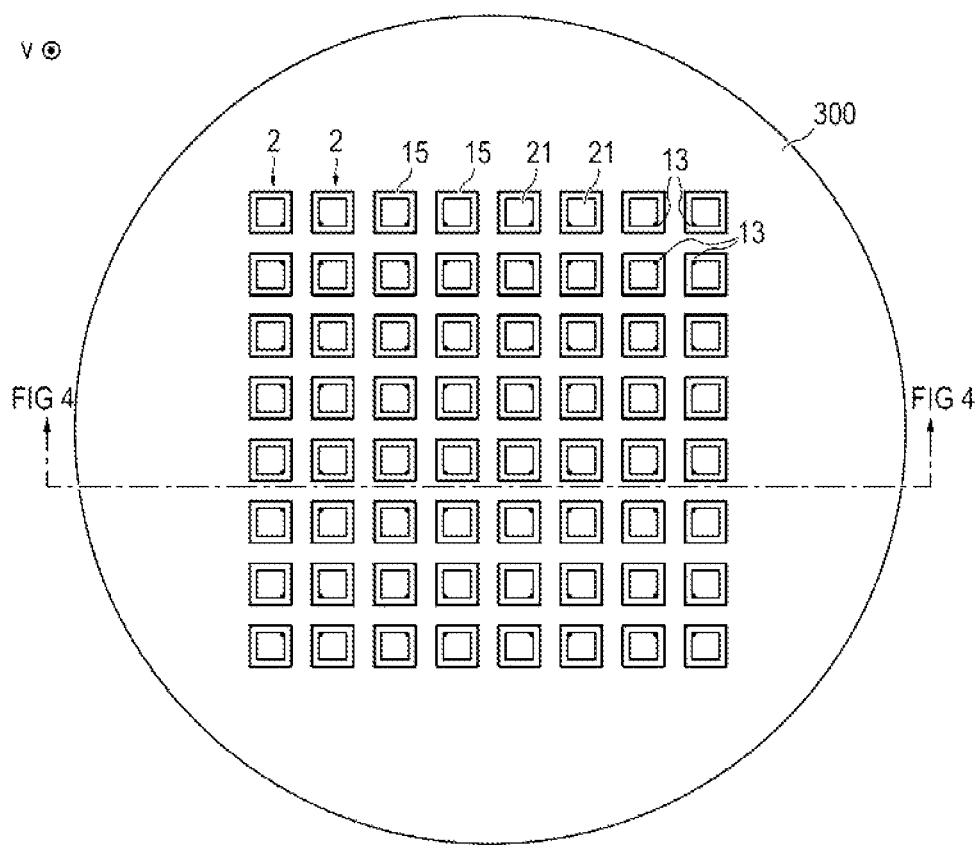
FIG. 3 shows a plan view of a carrier on which a plurality of chip assemblies embodied in accordance with FIG. 2 are arranged alongside one another.

FIG. 1 shows a semiconductor chip 1 and further parts for producing a chip assembly 2, such as is illustrated in FIG. 2. The semiconductor chip 1 comprises a semiconductor body 10 composed of a basic semiconductor material, in which, in particular, p-conducting and n-conducting semiconductor zones are contained in order to realize a power semiconductor component integrated into the semiconductor body 10. Moreover, the semiconductor chip 1 can also have as many electrically conductive layers as desired such as, for example, metallizations, silicide layers or layers composed of doped polycrystalline semiconductor material (for example polycrystalline silicon), but also as many dielectric layers as desired such as, for example, nitride layers (e.g. silicon nitride) or oxide layers (e.g. silicon oxide), or passivation layers such as e.g. imide layers. The basic semiconductor material can be any known basic semiconductor material that is customary for producing semiconductor components, for example arbitrary elemental semiconductors (e.g. silicon, germanium), arbitrary compound semiconductors (e.g. II-VI semiconductors such as zinc selenide or cadmium sulfide, III-V semiconductors such as gallium phosphide, gallium arsenide, indium phosphide, indium antimonide, or IV-IV semiconductors such as silicon carbide or silicon-germanium).

The semiconductor body 10 has a top side 10$t$ and an underside 10$b$ opposite the top side. The top side 10$t$ is spaced apart from the underside 10$b$ in a vertical direction v, wherein the vertical direction v runs perpendicularly to the underside 10$b$. A top main electrode 11 is arranged on the top side 10$t$, and a bottom main electrode 12 is arranged on the underside 10$b$. A control electrode 13 is likewise situated on the top side 10$t$. Furthermore, an optional top dielectric passivation layer 15 can be applied to the top side 10$t$. This passivation layer 15 can be a polyimide, for example.

The top main electrode 11, the bottom main electrode 12 and the control electrode 13 can be thin metallization layers, for example. Such metallization layers can be applied to the semiconductor body 10 for example as early as during the production of the semiconductor chip 1 in the wafer assemblage with further, identical semiconductor chips 1, that is to say before the wafer has yet been singulated to form mutually independent semiconductor chips 1.

As is illustrated in FIG. 2, an electrically conductive top compensation die 21 is situated on the side of the top main electrode 11 facing away from the semiconductor body 10 and is material bonded to the top main electrode 11 by means of a top connecting layer 31. Correspondingly, an electrically conductive bottom compensation die 22 is situated on the side of the bottom main electrode 12 facing away from the semiconductor body 10 and is material bonded to the bottom main electrode 12 by means of a bottom connecting layer 32. An electrically conductive contact piece 23 can optionally also be fitted on the control electrode 13, which contact piece is cohesively and electrically conductively connected to the control electrode 13 by means of the top connecting layer 31. If such a contact piece 23 is provided, the adjacent top compensation die 21 can have a cutout 211 (FIG. 1), in which the contact piece 23 is positioned later.

The compensation dies 21 and 22 serve, in particular, to reduce mechanical stresses which occur if such a compensation die 21, 22 is subjected to pressure contact-connection by a contact plate 41 and respectively 42 (e.g. composed of copper), which will be explained later, said contact plate having a coefficient of thermal expansion which is greatly different from the coefficient of thermal expansion of the semiconductor body 10. In the absence of compensation dies 21, 22, the contact plates 41 and 42 would make contact directly with the very thin main electrodes 11 and 12, respectively. On account of the thermomechanical stresses arising here, in the best case the electrical properties of the semiconductor chip 1 would vary; in the worst case, the semiconductor chip 1 can also crack.

The compensation dies 21 and 22 and—if present—the contact pieces 23 have (before mounting on the top main electrode 11, the bottom main electrode 12 and the control electrode 13, respectively, and directly after mounting) relatively large thicknesses d21', d22' and d23', respectively, in the vertical direction, for example at least 0.5 mm, at least 1 mm, or at least 1.5 mm. The large thicknesses are intended to prevent damage to the electrodes 11, 12 and 13 if the compensation dies 21 and 22 and, if appropriate, the contact pieces 23 are ground, as will be explained later.

Optionally, the top compensation die 21 and/or the bottom compensation die 22 can have a coefficient of linear thermal expansion that is significantly lower than the coefficient of linear thermal expansion of the top main electrode 11 and the bottom main electrode 12, in order to achieve an adaptation of the coefficient of linear thermal expansion to the low coefficient of linear thermal expansion of the semiconductor body 10. By way of example, the top compensation die 21 and/or the bottom compensation die 22, at a temperature of 20° C., can have a coefficient of linear thermal expansion of less than 11 ppm/K or even of less than 7 ppm/K. In this case, the top compensation die 21 and/or the bottom compensation die 22 can for example consist of one of the following materials or comprise one of the following constructions: molybdenum; a metal matrix composite material (MMC), for example AlSiC (aluminum silicon carbide); a multilayer material comprising two or more metal layers, for example a three-layer material having the layer sequence copper-molybdenum-copper (Cu—Mo—Cu), e.g. having layer thicknesses in the ratio of 1:4:1, which produces a coefficient of expansion of the Cu—Mo—Cu three-layer material of approximately 7.3 ppm/K.

The top connecting layer 31 can be embodied for example as an arbitrary solder layer, in particular also as a diffusion solder layer, as a sintered layer containing a sintered metal powder (e.g. silver powder or silver flakes), or an electrically conductive adhesive layer. Independently thereof, the bottom connecting layer 32 can also be embodied as an arbitrary solder layer, in particular also as a diffusion solder layer, as a sintered layer containing a sintered metal powder (e.g. silver powder or silver flakes), or an electrically conductive adhesive layer. The top connecting layer 31 and the bottom connecting layer 32 can consist of the same material, in particular; however, it is also possible to use arbitrary combinations of the materials mentioned for the two layers.

In FIG. 1, the starting materials used for producing the top connecting layer 31 and the bottom connecting layer 32 are designated by 31' and 32', respectively. This is intended to express the fact that the original connecting means 31' and 32' can be present in an altered form after the connection has been produced.

In the case of a starting material 31', 32' embodied as solder (for example a tin-containing solder), the resulting connecting layer 31 and 32, respectively, can contain a material (e.g. copper) which diffused into the solder from the top main electrode 11 and the bottom main electrode 12, respectively, during the connection process and thus constitutes a constituent of the finished connecting layer 31 and 32, respectively. In order to produce the connections, the solder 31', 32' can be applied in the form of a solder paste, for example, to the main electrodes 11, 12 and/or to the compensation dies (for example by screen or stencil printing). Likewise, however, the solder 31', 32' can also be introduced in the form of a prefabricated solder lamina ("preform solder") between the top compensation die 21 and the top main electrode 11 and respectively between the bottom compensation die 22 and the bottom main electrode 12. In any case the solder paste or the solder lamina/dies for producing the connections explained are melted and subsequently cooled, such that a cohesive connection in each case arises between the top compensation die 21 and the top main electrode 11 and respectively between the bottom compensation die 22 and the bottom main electrode 12.

In the case of a connecting layer 31 and 32 embodied as a sintered layer, the starting material 31' and 32', respectively, on which said layer is based can be embodied as a paste containing a metal powder (e.g. silver powder or silver flakes) and a solvent. In order to produce the connections, the paste can be applied, for example, to the main electrodes 11, 12 and/or to the compensation dies 21, 22 (for example by screen or stencil printing). A paste layer formed from the paste is then arranged between the top main electrode 11 and the top compensation die 21 and makes contact with each of them. Correspondingly, a further paste layer formed from the paste is arranged between the bottom main electrode 12 and the bottom compensation die 22 and makes contact with each of them. In this state, the paste layers are dried by evaporation of the solvent contained therein and are then sintered, wherein the sintering can be carried out at temperatures of significantly less than 250° C. As a result of the sintering, the (electrically conductive) top connecting layer 31 and respectively the (electrically conductive) bottom connecting layer 32 are formed from the two paste layers.

In the case of a connecting layer 31 and 32 embodied as an electrically conductive adhesive layer, the starting material 31' and 32', respectively, on which said layer is based can be embodied as an electrically conductive adhesive. In order to produce the connections, the adhesive can be applied, for example, to the main electrodes 11, 12 and/or to the compensation dies 21, 22 (for example by screen or stencil printing). A top adhesive layer formed from the adhesive is arranged between the top main electrode 11 and the top compensation die 21 and makes contact with each of them. As a result of the subsequent curing, the electrically conductive top connecting layer 31 is formed from the top adhesive layer. Correspondingly, a bottom adhesive layer formed from an adhesive is arranged between the bottom main electrode 12 and the bottom compensation die 22 and makes contact with each of them. As a result of the subsequent curing, the electrically conductive bottom connecting layer 32 is formed from the bottom adhesive layer.

If an optional contact piece 23 is provided, it can be material bonded to the control electrode 13 by means of any of the connecting techniques such as have already been explained for the connection between the top compensation die 21 and the top main electrode 11, to be precise independently of the connecting technique chosen for the connection between the top compensation die 21 and the top main electrode 11.

Figure 4:
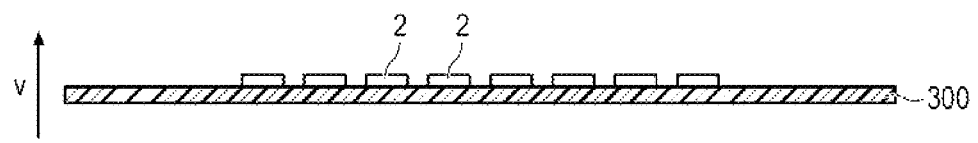
FIG. 4 shows a vertical section through the arrangement in accordance with FIG. 3.

As is furthermore shown in vertical section in FIG. 3 and in FIG. 4, then a plurality of chip assemblies 2, each of which has a semiconductor chip 1 and, as explained, is equipped with a top and bottom compensation die 21 and 22, respectively, and optionally with a contact piece 23, are then placed alongside one another onto the same side of a common carrier 300. Optionally, the placement can be effected—as shown—such that from all the chip assemblies 2 the top compensation dies 21 face away from the carrier 300. In principle, however, it is also possible, in one or more of the chip assemblies 2, for the top compensation dies 21 to face away from the carrier 300, while in one or more other chip assemblies 2 the top compensation dies 21 face the carrier 300.

The placement of the chip assemblies 2 on the carrier 300 can be effected such that they are situated in predefined positions relative to one another. In order to prevent the placed chip assemblies 2 from slipping, the surface of the carrier 300 can be embodied such that the chip assemblies 2 adhere thereto. By way of example, for this purpose the carrier 300 can have an adhesive film onto which the chip assemblies 2 are placed.

Figure 5:
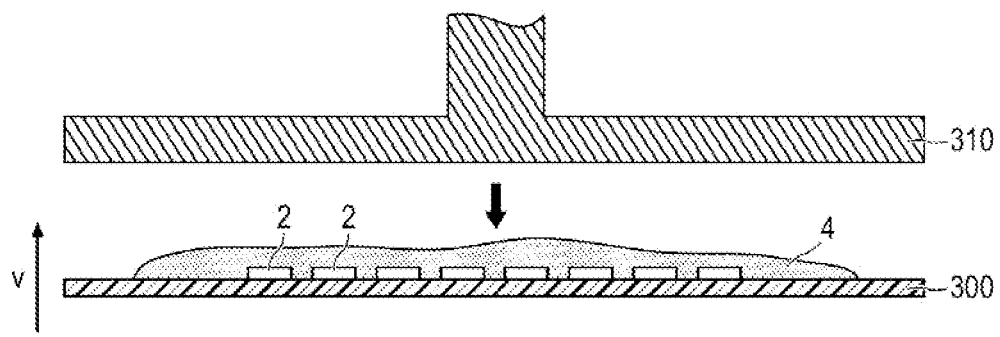
FIG. 5 shows the arrangement in accordance with FIG. 4 after the application of an embedding compound to the chip assemblies situated on the carrier, before the embedding compound is pressed onto the carrier by means of a stamp.
Figure 6:
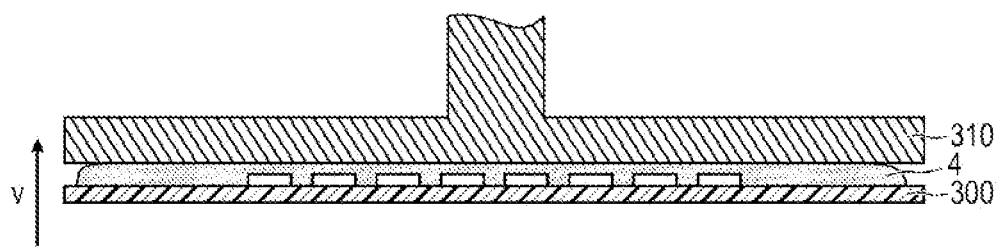
FIG. 6 shows the arrangement in accordance with FIG. 5 during the process of pressing the embedding compound onto the carrier.

As is furthermore shown in FIGS. 5 and 6, after the chip assemblies 2 have been placed onto the carrier 300 a viscous embedding compound 4 is applied over the chip assemblies 2 situated on the carrier 300. The embedding compound 4 is then pressed against the carrier 300 by means of a stamp 310, such that at least the interspaces situated between respectively adjacent chip assemblies 2 are filled with the embedding compound 4.

Figure 7:
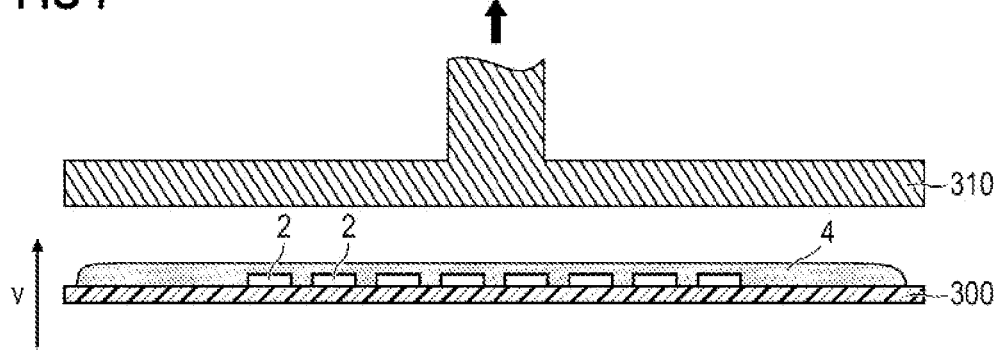
FIG. 7 shows the arrangement in accordance with FIG. 6 after the stamp has been lifted off.

The embedding compound 4 is then cured, such that the chip assemblies 2 embedded into the embedding compound 4 together with the embedding compound 4 form a solid composite 5. As is furthermore shown in FIG. 7, the stamp 310 can be lifted off from the solid composite 5 after the curing of the embedding compound 4, and the composite 5 can be removed from the carrier 300. FIG. 8 shows the composite 5 then present. The embedding compound 4, which is dielectric at least in the cured state, has the effect that the chip assemblies 2 are fixedly and material bonded to one another. Examples of a suitable embedding compound include polycondensed polymers (e.g. an epoxy resin or a polyurethane-based potting material). In principle, however, for all configurations of the invention, any embedding compounds 4 can be used, provided that they are dielectric in the cured state. In particular, an embedding compound according to the present invention can be formed from a homogeneous material or a homogeneous material mixture.

A top cover layer 51 of the composite 5 and/or a bottom cover layer 52 of the composite 5 can then be removed from the composite 5, such that from the composite 5 a residual composite 6 remains. In the case of the residual composite 6, too, the embedding compound 4 has the effect that the chip assemblies 2 are fixedly connected to one another. In this case, the embedding compound 4 can optionally bear directly against the semiconductor body 10 of each of the chip assemblies 2, that is to say against the semiconductor material thereof. FIG. 8 and—in an enlarged excerpt—FIG. 9 show the composite 5 before the removal of here both a top cover layer 51 and a bottom cover layer 52. Correspondingly, FIG. 10 and—in an enlarged excerpt—FIG. 11 show the residual composite 6 after the removal of here both the top cover layer 51 and the bottom cover layer 52. In FIGS. 8 to 10, the plane E1 indicates the interface between the top cover layer 51 and the residual composite 6. Correspondingly, the plane E2 indicates the interface between the bottom cover layer 52 and the residual composite 6. The planes E1 and E2 preferably run parallel to one another.

Insofar as a top cover layer 51 is removed from the composite 5, in this case the cured embedding compound 4 is partly removed from the composite 5. Moreover, in each of the chip assemblies 2 the top compensation die 21 of the relevant chip assembly 2 is partly removed from the composite 5.

Insofar as, additionally, a bottom cover layer 52 is removed from the composite, in this case the cured embedding compound 4 is likewise partly removed from the composite 5. Moreover, in each of the chip assemblies 2 the bottom compensation die 22 of the relevant chip assembly 2 is partly removed from the composite 5.

In any case, even after the removal of the top cover layer 51 and, if appropriate, the bottom cover layer 52, the embedding compound 4 ensures that the chip assemblies 2 are fixedly and material bonded to one another and together with the embedding compound 4 form a residual composite 6.

The top cover layer 51 and, if appropriate, the bottom cover layer 52 can be removed for example by the machining (grinding, polishing, lapping, etc.) of the composite 5 in a conventional wafer grinding installation. What can be achieved thereby is that the residual composite 6 (apart from small dishing effects) has plane-parallel surfaces at which the (ground) top compensation dies 21, the (ground) bottom compensation dies 22 and, if appropriate, the (ground) contact piece 23 terminate flush with the embedding compound 4.

After the removal of the top cover layer 51 and/or the bottom cover layer 52, the semiconductor chips 1, the top connecting layers 31 and the bottom connecting layers 32 of each of the chip assemblies 2 remain in the residual composite 6. Moreover, in each of the chip assemblies 2, the residue of the top compensation die 21 remaining after the removal of the top cover layer 51 is then exposed, i.e. the side of the top compensation die 21 facing away from the semiconductor body 10 is not covered or at least not completely covered by the embedding compound 4. Correspondingly, in each of the chip assemblies 2, insofar as a bottom cover layer 52 was removed, the residue of the bottom compensation die 22 remaining after the removal of the bottom cover layer 52 is exposed, i.e. the side of the bottom compensation die 22 facing away from the semiconductor body 10 is not covered or at least not completely covered by the embedding compound 4. Insofar as a compensation piece 23 was fixed on the control electrode 13 before the encapsulation of the chip assemblies with the embedding compound 4, said compensation piece 23 can be exposed after the removal of the top cover layer 51 and/or of a bottom cover layer 52 in each of the chip assemblies 2, i.e. the side of the compensation pieces 23 facing away from the semiconductor body 10 is not or at least not completely covered by the embedding compound 4.

As a result of the removal of a top cover layer 51, the thickness d21 of the top compensation die 21 is reduced compared with its original thickness d21' (see FIG. 1), for example by approximately 0.1 mm. However, the reduced thickness d21 can still be, for example, at least 0.4 mm, at least 0.9 mm, or at least 1.4 mm. The same correspondingly applies to the thickness d23 of the contact piece 23 in comparison with the original thickness d23' thereof (see FIG. 1).

Moreover, as a result of the removal of a bottom cover layer 52, the thickness d22 of the bottom compensation die 22 is reduced compared with its original thickness d22' (see FIG. 1), for example by approximately 0.1 mm. However, the reduced thickness d22 can still be, for example, at least 0.4 mm, at least 0.9 mm, or at least 1.4 mm.

Figure 12:
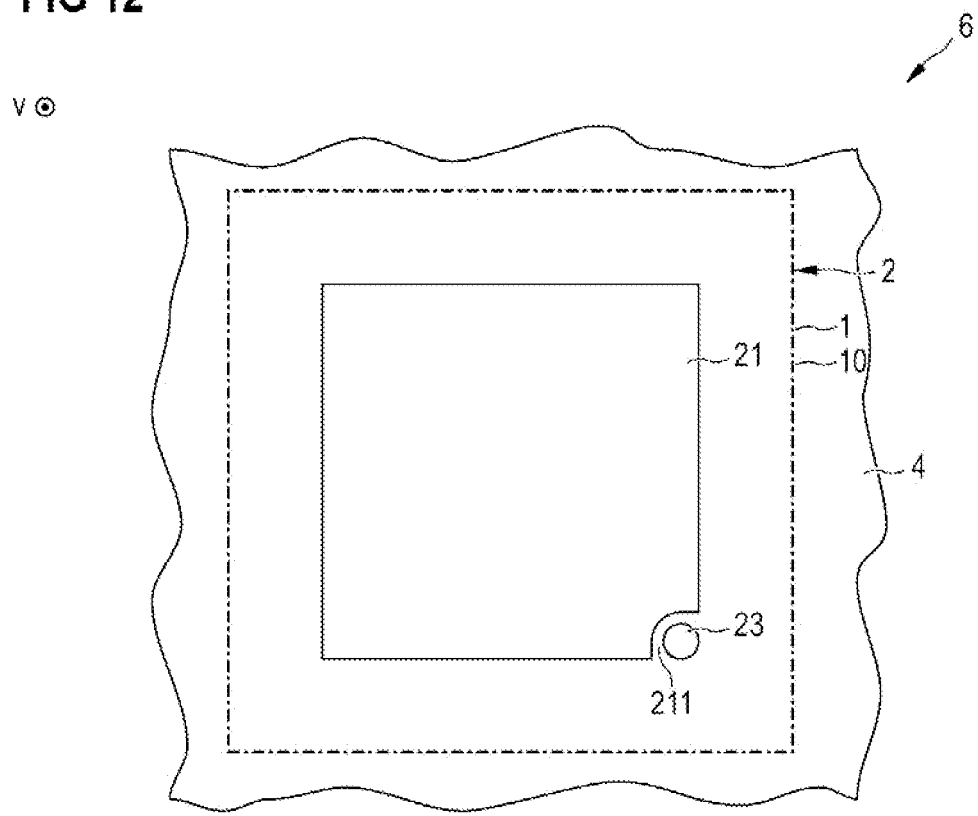
FIG. 12 shows a plan view of a portion of the residual composite with one of the chip assemblies.
Figure 13:
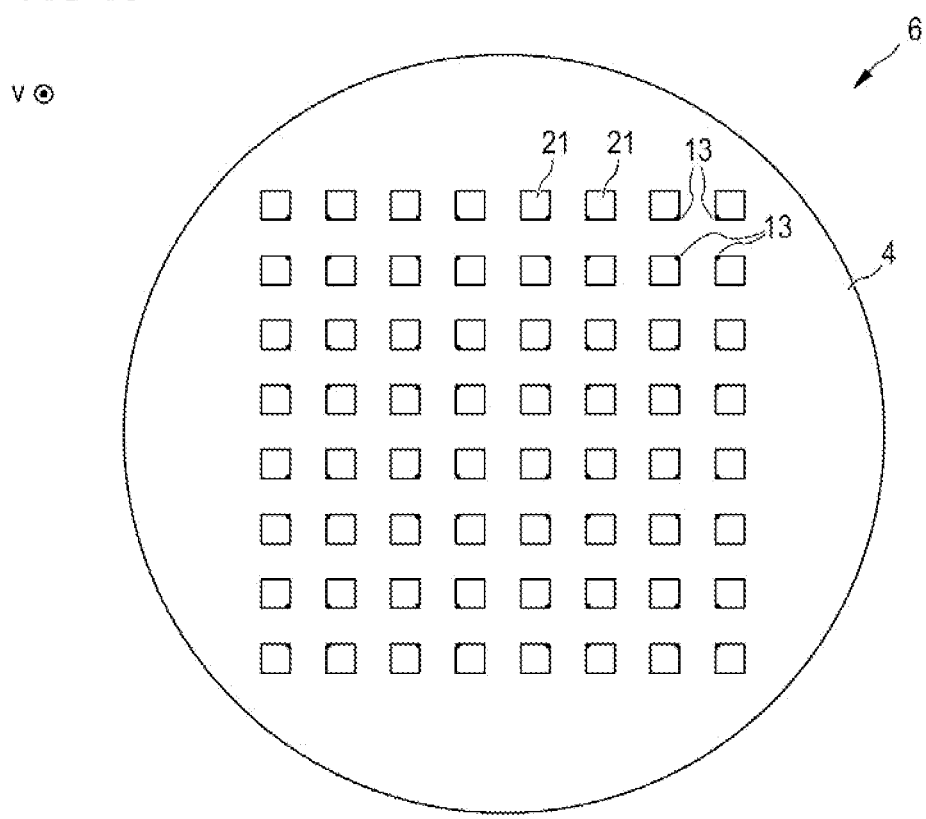
FIG. 13 shows a plan view of the entire residual composite.

FIG. 12 shows a plan view of a portion of the residual composite 6 with a chip assembly 2. The contours of the semiconductor body 10 that are concealed by the embedding compound 4 are illustrated by dashed lines. As can be discerned here, moreover, the semiconductor chip 1 and thus also the semiconductor body 10 is surrounded by the embedding compound 4 in a ring-shaped fashion. The (ground) top compensation die 21 and the optional (ground) contact piece 23 are embedded into the embedding compound 4 in a flush fashion and are freely accessible, such that they can be electrically contact-connected without any problems. FIG. 13 shows a plan view of the entire residual composite 6. In the case of the individual chip assemblies 2, the embedding compound 4 encloses the semiconductor body 10 of the original semiconductor chip 1 laterally circumferentially in a ring-shaped fashion in such a way that those sides of the top compensation die 21 which face away from the semiconductor body 10 and those sides of the bottom compensation die 22 of this chip assembly 2 which face away from the semiconductor body 10 are completely or at least partly exposed and can be subjected to electrical contact-connection externally as a result.

The embedding compound 4 firstly serves to fixedly connect the individual chip assemblies 2 to one another, but secondly also to ensure the insulation strength of the chip assemblies 2. In order to ensure a sufficient insulation strength between directly adjacent chip assemblies 2 in the completed semiconductor arrangement 7, the embedding compound 4 can have a minimum width b4 perpendicularly to the vertical direction v between the lateral edges of the semiconductor bodies 10 of adjacent chip assemblies 2. By way of example, the minimum width b4 can be at least 200 μm, see FIG. 11. The spacing d10 between the semiconductor bodies 10 of the directly adjacent chip assemblies 2 is then likewise at least b4, that is to say for example at least 200 μm. Independently thereof, the width b4 and the spacing d10 between directly adjacent chip assemblies 2 can be chosen to be less than or equal to 2 mm or less than or equal to 5 mm.

Figure 14:
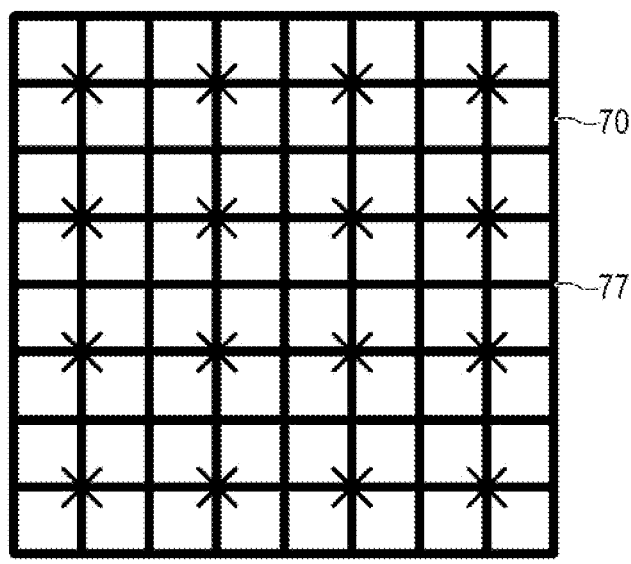
FIG. 14 shows a plan view of a control electrode interconnection structure.
Figure 15:
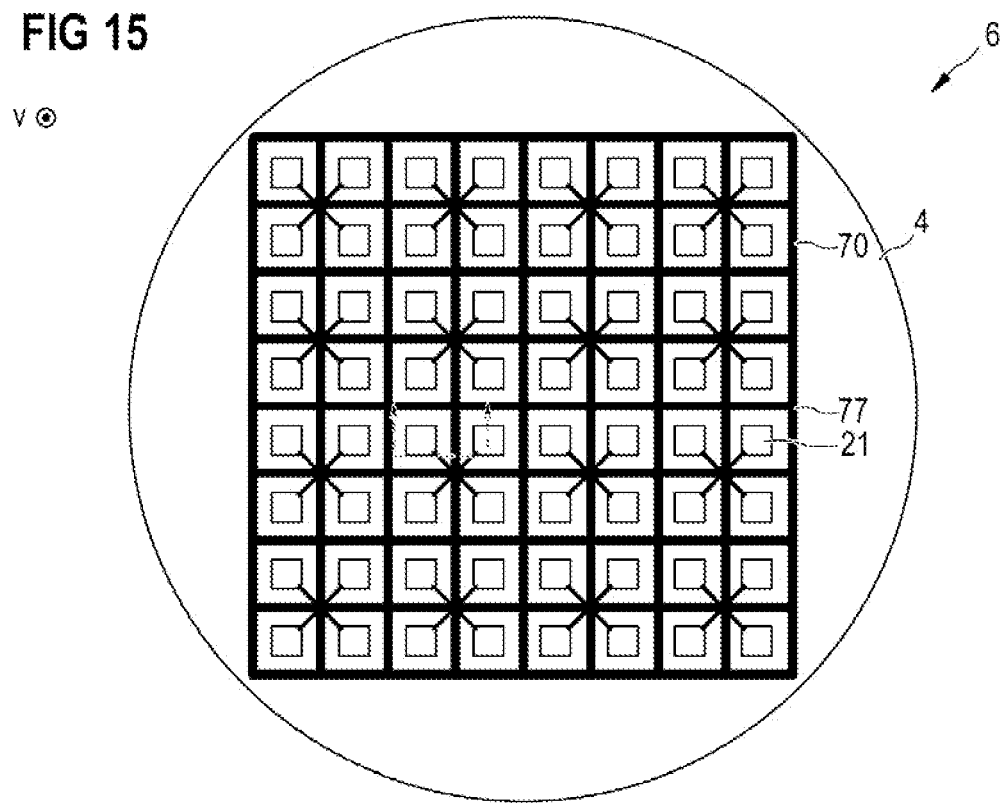
FIG. 15 shows the control electrode interconnection structure in accordance with FIG. 14 after placement onto the composite illustrated in FIG. 13.
Figure 24:
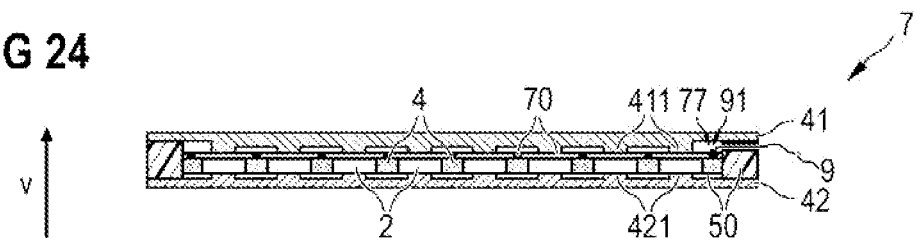
FIG. 24 shows the sectional view of the finished assembled semiconductor arrangement in accordance with FIGS. 19 to 24.

Using a residual composite 6 having two or more identical chip assemblies 2, a semiconductor arrangement 7 can then be produced, such as is shown as the result in FIG. 24. For this purpose, a control electrode interconnection structure 70 is provided, which serves to electrically conductively connect the control electrodes 13 of the chip assemblies 2 to one another. FIG. 14 shows one example of such a control electrode interconnection structure 70. A control electrode interconnection structure 70 can be produced by means of a wide variety of technologies. In any case, a control electrode interconnection structure contains a conductor structure. A control electrode interconnection structure 70 can be placed onto the residual composite 6 as a prefabricated element, for example as a printed circuit board or as a wire grid, and can optionally be material bonded to said residual composite. It is likewise possible, however, to construct the control electrode interconnection structure 70 on the residual composite 6. Examples of various alternatives will be explained below. FIG. 15 shows the control electrode interconnection structure 70 applied to the residual composite in accordance with FIG. 13, said control electrode interconnection structure electrically conductively connecting the control electrodes 13 (FIG. 2) to one another. While the arrangement in accordance with FIG. 15 has a substantially circular basic area, the arrangement in accordance with FIG. 16 has a substantially rectangular basic area with the same construction otherwise. In principle, however, a residual composite 6 can have an arbitrarily shaped basic area. The number and the relative arrangement of the individual chip assemblies 2 can also be chosen arbitrarily, in principle.

Figure 16:
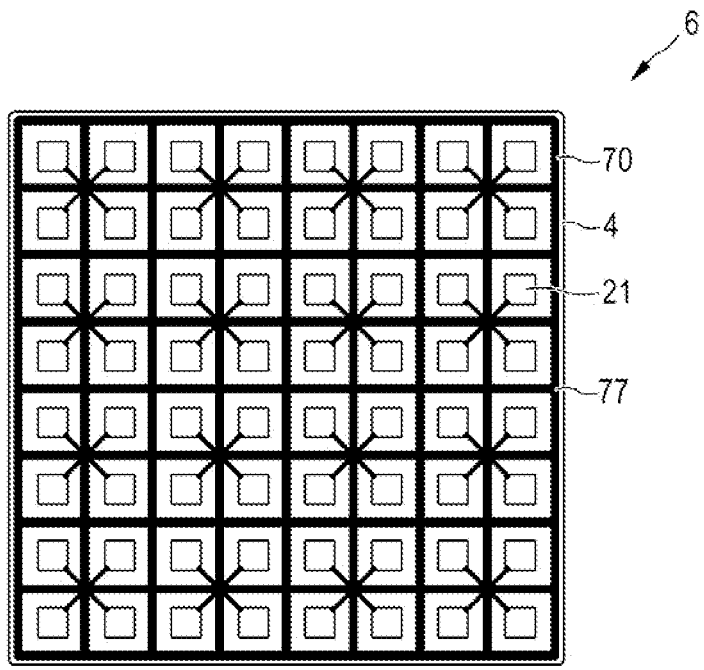
FIG. 16 shows the control electrode interconnection structure in accordance with FIG. 14 after placement onto a composite which differs from the composite in accordance with FIG. 13 in that it has a substantially rectangular basic area.
Figure 17:
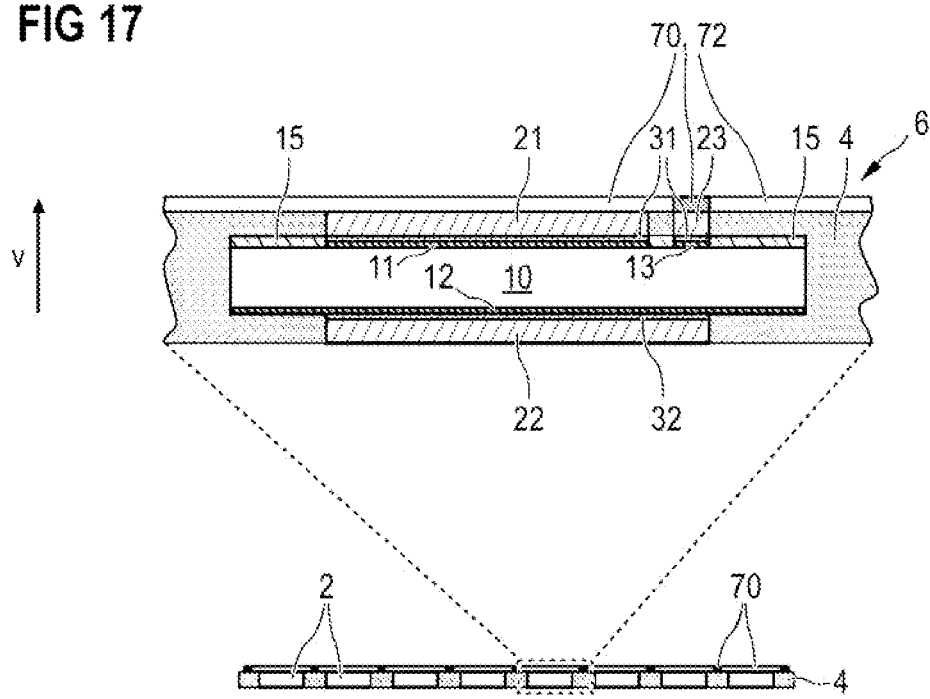
FIG. 17 shows a cross section through a portion of the residual composite shown in FIG. 11 after the application of a first configuration of a control electrode interconnection structure.

FIG. 17 (bottom) shows a vertical section through the arrangement in accordance with FIG. 16. The enlarged sectional view of a portion of the residual composite 6 in accordance with FIG. 17 (top) reveals a conductor structure 72 as part of the control electrode interconnection structure 70. The conductor structure 72 can be implemented for example by the deposition of an electrically conductive material, for example a metal or a doped polycrystalline semiconductor material, onto the residual composite 6 using thin-film technology. The deposition can be effected for example by a chemical and/or physical deposition method such as e.g. PVD (PVD=physical vapor deposition) or CVD (CVD=chemical vapor deposition), by sputtering or by electrical or electroless plating. The deposition can be carried out conformally. The completed deposited conductor structure 72 can have a thickness in the range of 30 μm to 70 μm, for example.

In each of the methods mentioned, a closed layer of the electrically conductive material can firstly be produced on the residual composite 6 and then structured, for example photolithographically by means of a mask. It is likewise possible firstly to apply a mask layer to the residual composite 6, to structure the mask layer such that it has openings, and then to deposit the electrically conductive material on the structured mask layer, such that the electrically conductive material bears on the residual composite 6 in the region of the mask openings and electrically conductively connects the control electrodes 13 to one another with formation of the conductor structure 72.

Figure 18:
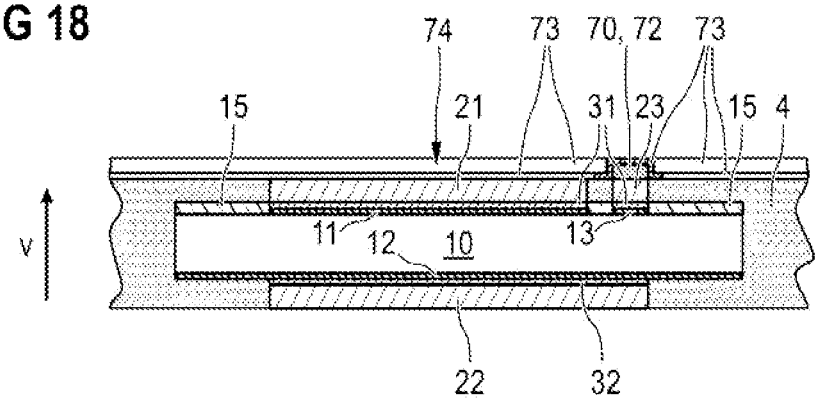
FIG. 18 shows a cross section through a portion of the residual composite shown in FIG. 11 after the application of a second configuration of a control electrode interconnection structure.

As is furthermore shown in FIG. 18, a dielectric layer 73 can optionally be applied to the conductor structure 72 in order to electrically insulate the latter from a top contact plate 41 to be applied later (see FIG. 19). Such a dielectric layer 73 can be applied by any desired technique. By way of example, a dielectric material can be applied by deposition (e.g. PVD or CVD or sputtering) onto the conductor structure 72. It is likewise possible to place or adhesively bond a stamped dielectric plate or a dielectric film onto the conductor structure 72.

The dielectric layer 73 can be embodied as a prefabricated layer provided with cutouts 74 which is applied to the composite 6 provided with the conductor structure 72 in such a way that the cutouts 74 are arranged above the top compensation dies 21 and contact can be made with the top compensation dies 21 through the dielectric layer 73 and the conductor structure 72.

Alternatively, it is also possible firstly to apply the dielectric layer 73 as a closed layer to the composite 6 provided with the conductor structure 72, such that the closed layer covers the conductor structure 72 and the top compensation dies 21, and then to provide the closed layer, above the top compensation dies 21, with cutouts 74 through which contact can be made with the dielectric layer 73 and the conductor structure 72.

A further alternative consists in applying the dielectric layer 73 already in structured form to the composite 6 provided with the conductor structure 72, such that the closed layer covers the conductor structure 72 but above the top compensation dies 21 has cutouts 74 through which contact can be made with the dielectric layer 73 and the conductor structure 72.

Figure 19:
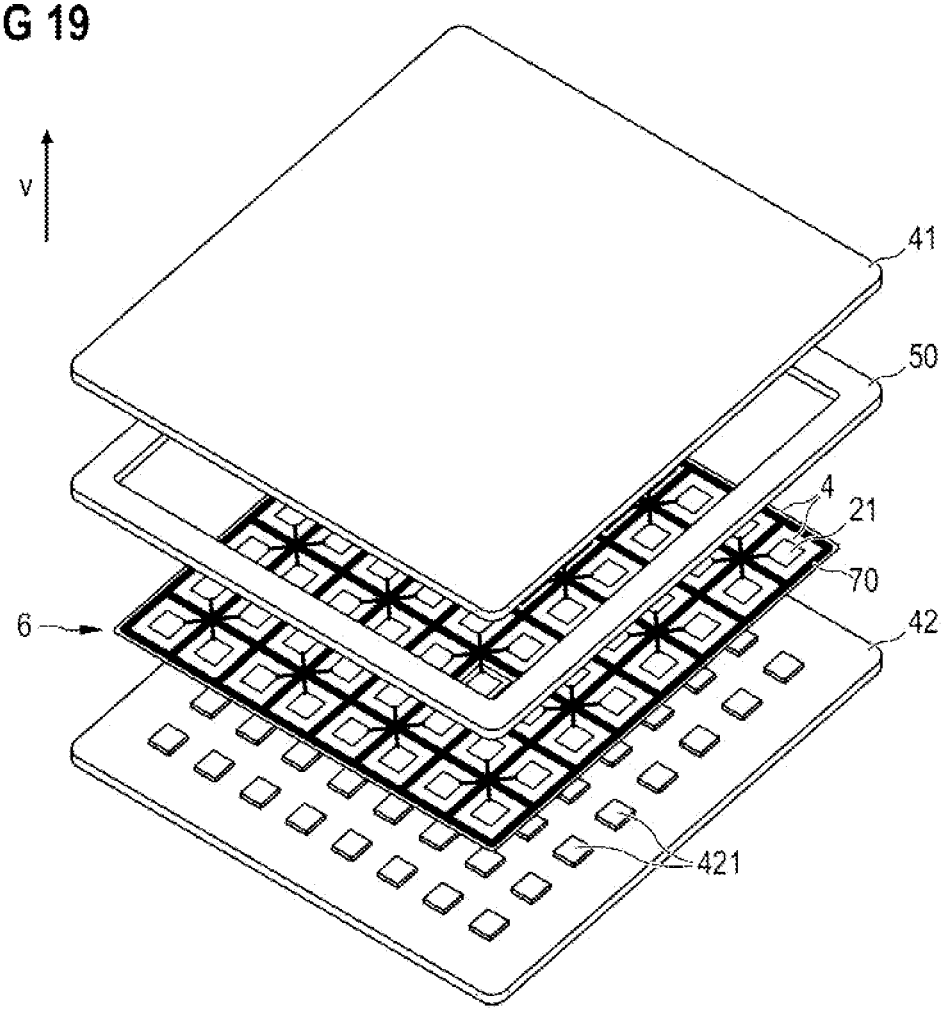
FIG. 19 shows an exploded illustration of a semiconductor arrangement in which a residual composite is arranged between a top and a bottom contact plate.
Figure 20:
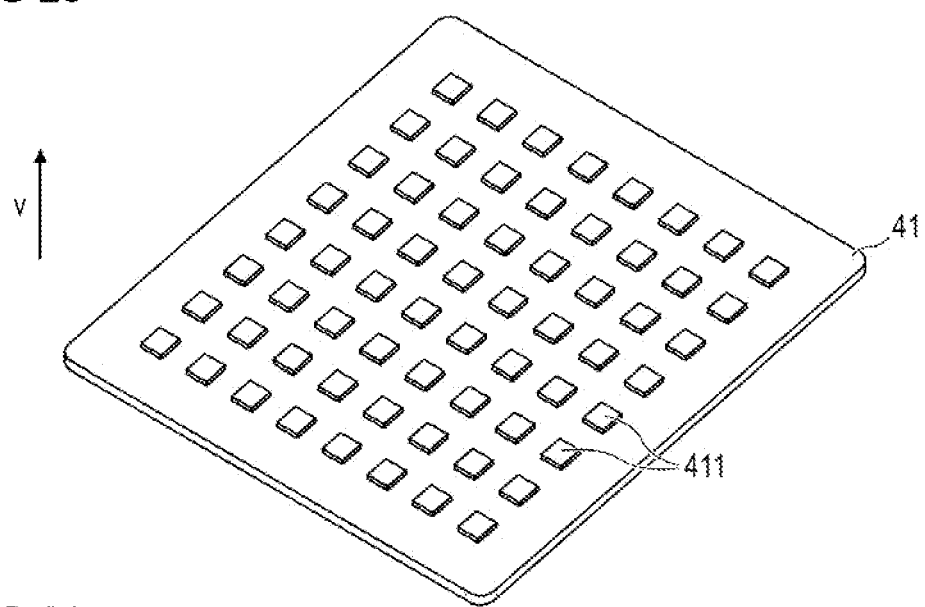
FIG. 20 shows a perspective view of the bottom contact plate shown in FIG. 19 looking at that side of said contact plate which faces the chip assemblies.
Figure 21:
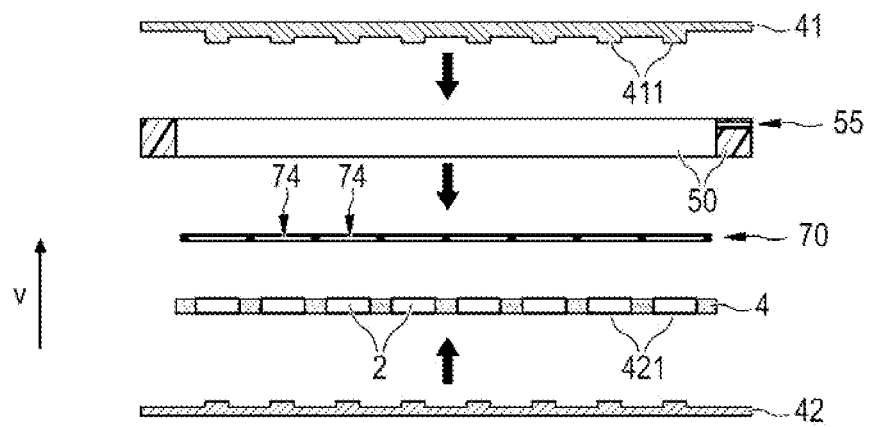
FIG. 21 shows a sectional view of the exploded illustration shown in FIG. 19.
Figure 22:
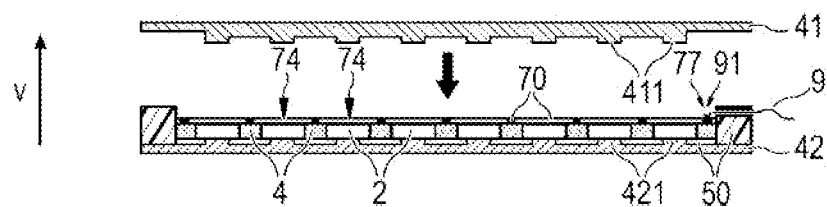
FIG. 22 shows the sectional view in accordance with FIG. 21 during the assembly of the semiconductor arrangement.
Figure 23:
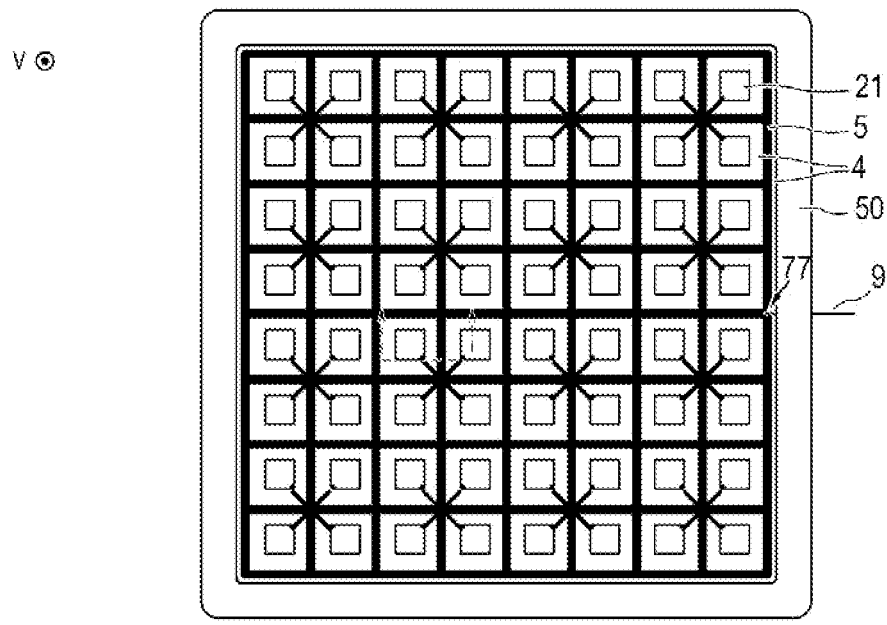
FIG. 23 shows a plan view of the semiconductor arrangement in accordance with FIG. 22 before the placement of the top contact plate.

FIG. 19 shows an exploded illustration of the finished semiconductor arrangement 7, shown in FIG. 24, FIGS. 21 and 22 show the semiconductor arrangement 7 during the assembly thereof, and FIG. 23 shows a plan view of the arrangement in accordance with FIG. 22 without the top contact plate 41. As is evident from these figures, the semiconductor arrangement 7 comprises a residual composite 6 provided with a control electrode interconnection structure 70, an electrically conductive top contact plate 41, an electrically conductive bottom contact plate 42, and a spacer ring 50. The residual composite 6 provided with the control electrode interconnection structure 70 is arranged between the top contact plate 41 and the bottom contact plate 42. The top contact plate 41 serves to make electrical and mechanical contact with, from each of the chip assemblies 2, the compensation die 21, 22 (here: the top compensation dies 21) facing the top contact plate 41. For this purpose, the top contact piece 41 has a contact pedestal 411 for each of the chip assemblies 2 (in this respect, see FIG. 20, which shows the top contact piece 41 in an upside down position relative to FIG. 19), which contact pedestal makes electrical and mechanical contact with one of the compensation dies 21, 22 (here: the top compensation dies 21) of the relevant chip assembly 2.

Correspondingly, the bottom contact plate 42 serves to make electrical and mechanical contact with, from each of the chip assemblies 2, the compensation die 21, 22 (here: the bottom compensation dies 22) facing the bottom contact plate 42. For this purpose, the bottom contact piece 42 has a contact pedestal 421 for each of the chip assemblies 2, which contact pedestal makes electrical and mechanical contact with one of the compensation dies 21, 22 (here: the bottom compensation dies 22) of the relevant chip assembly 2.

Suitable materials for the top contact piece 41 and/or the bottom contact piece 42 include copper, for example, which optionally can be provided superficially with a thin nickel layer. In principle, however, use can also be made of any other electrically conductive materials, in particular metals or metal alloys, for example aluminum or an aluminum alloy or a copper alloy.

In the example shown, in each of the chip assemblies 2 of the semiconductor arrangement 7 the top contact die 21 is situated on the side of the chip assembly 2 facing the top contact plate 41, and the bottom contact die 22 is situated on the side of the chip assembly 2 facing the bottom contact plate 42.

In a departure therefrom, other semiconductor arrangements can have a first subset of the chip assemblies 2 and a second subset of the chip assemblies 2, wherein in each of the chip assemblies 2 of the first subset the top contact die 21 is situated on the side of the chip assembly 2 facing the top contact plate 41, and the bottom contact die 22 is situated on the side of the chip assembly 2 facing the bottom contact plate 42, and wherein in each of the chip assemblies 3 of the second subset the top contact die 21 is situated on the side of the chip assembly 2 facing the bottom contact plate 42, and the bottom contact die 22 is situated on the side of the chip assembly 2 facing the top contact plate 41.

It is likewise possible that in each of the chip assemblies 2 of a semiconductor arrangement the top contact die 21 is situated on the side of the chip assembly 2 facing the bottom contact plate 41, and the bottom contact die 22 is situated on the side of the chip assembly 2 facing the top contact plate 41.

The spacer ring 50, which is arranged between the contact plates 41 and 42 and surrounds the residual composite 6 in a ring-shaped manner, consists of a dielectric material, for example ceramic. This prevents an electrical short circuit between the contact plates 41 and 42. As also in all of the other configurations of the invention the spacer ring 50 can be connected cohesively, for example by soldering, adhesive bonding or sintering, both to the top contact plate 41 and to the bottom contact plate 42.

As an alternative or in addition to a control electrode interconnection structure 70 which, as explained above, is arranged between the residual composite 6 and the top contact plate 41, the control electrode interconnection structure 70 or a further control electrode interconnection structure could correspondingly also be arranged between the residual composite and the bottom contact plate 42, in order to electrically connect control electrodes 13 accessible at that side of the residual composite 6 which faces the bottom contact piece 42.

If at least one control electrode interconnection structure 70 is present, an electrically conductive control contact 9 (see FIGS. 22, 23 and 24) can be provided for each of the control electrode interconnection structures 70 in order to be able to make electrical contact with the relevant control electrode interconnection structure 70 from outside the completed semiconductor arrangement 7 (see FIG. 24). For this purpose, the control contact 9 can be led for example through a through opening or groove 55 (see FIG. 21) formed in the spacer ring 50, from the inner side of the spacer ring 50 to the outer side of the semiconductor arrangement 7. Within the spacer ring 50, the control contact 9 is electrically conductively connected to the control electrode interconnection structure 70 and thus to the control electrodes 13. In order to realize the electrical connection between the control contact 9 and the control electrode interconnection structure 70, the control contact 9 can have a contact spring 91, for example, which is prestressed during the mounting of the semiconductor arrangement 7 or in some other way and is thereby pressed against an electrical terminal location 77 of the control electrode interconnection structure 70 and makes electrical contact therewith. As an alternative or in addition to pressing, however, the control contact 9 can be electrically conductively connected to the terminal location 77 cohesively, for example by soldering, electrically conductive adhesive bonding or by means of a sintered connection.

Figure 25:
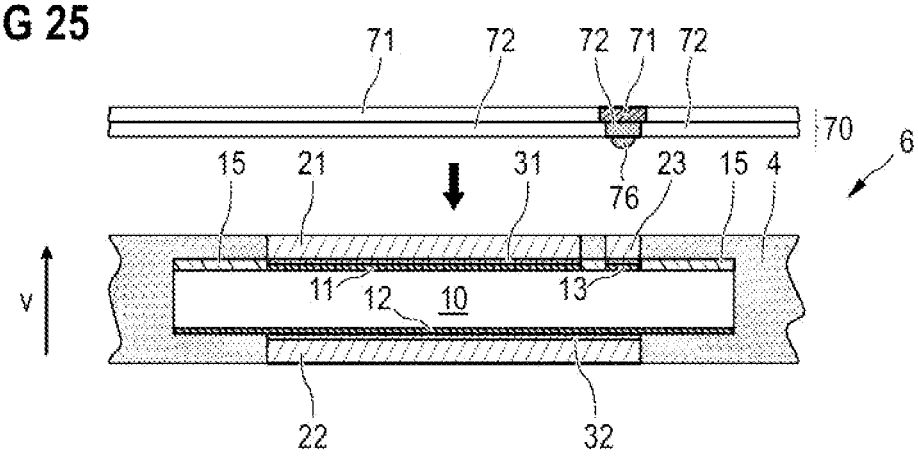
FIG. 25 shows a cross section through a portion of the residual composite shown in FIG. 11 before the application of a third configuration of a control electrode interconnection structure.
Figure 26:
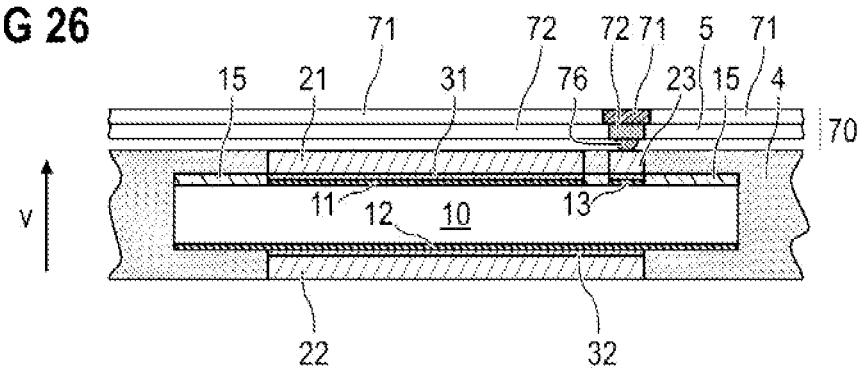
FIG. 26 shows the arrangement in accordance with FIG. 25 after the application of the control electrode interconnection structure.

As can furthermore be discerned with the aid of an enlarged cross-sectional view shown in FIGS. 25 and 26, a control electrode interconnection structure 70 can be embodied, for example, as a prefabricated printed circuit board (e.g. an FR4 printed circuit board) having a dielectric carrier 71 and a conductor structure 72, e.g. a metallization, applied to the carrier 71 and fixedly connected thereto. Such a printed circuit board can be mounted as a prefabricated unit on the residual composite 6 and can be electrically conductively connected to the control electrodes 13 in the process.

FIG. 25 shows the control electrode interconnection structure 70 before the mounting thereof on the residual composite 6, and FIG. 26 after said mounting. Optionally, the control electrode interconnection structure 70 can have an electrically conductive contact element 76 arranged on a conductor track portion of the printed circuit board. By way of example, the contact element 76 can be a solder, an adhesive or a sinterable paste for producing a cohesive and electrically conductive connection to the control electrode 13. Likewise, the contact element 76 could also be a thin pin which is cohesively and electrically conductively connected to the conductor structure 72 and which, during the placement of the control electrode interconnection structure 70, is press-fitted into a prefabricated hole in the contact element 23, thereby giving rise to an electrically conductive connection between the conductor structure 72 and the control electrode 13.

In the case of a semiconductor arrangement 7 as described in the present case, the residual composite 6 can be loosely clamped in and electrically contact-connected between the top contact plate 41 and the bottom contact plate 42. As in all of the configurations of the invention, the relevant electrical contact-connections between the chip assemblies 2 and the top contact plate 41 and those between the chip assemblies 2 and the bottom contact plate 42 can be embodied exclusively as pressure contacts and thus without a cohesive connection.

Figure 27:
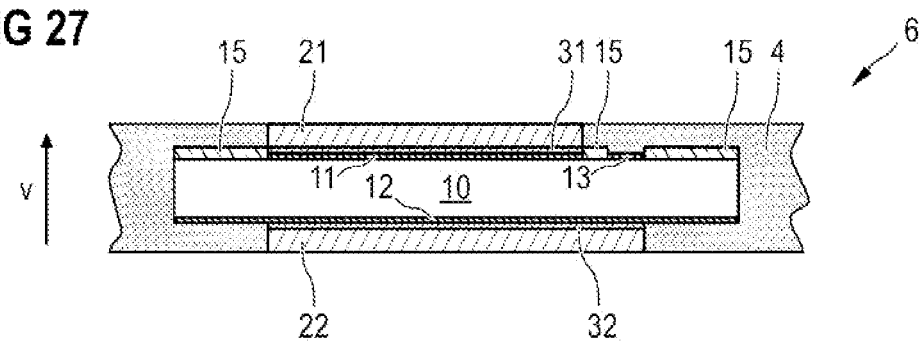
FIG. 27 shows a cross section through a portion of a residual composite which differs from the residual composite shown in FIG. 11 in that no electrically conductive contact piece is applied to the control electrode, rather the control electrode is covered by the embedding compound.
Figure 28:
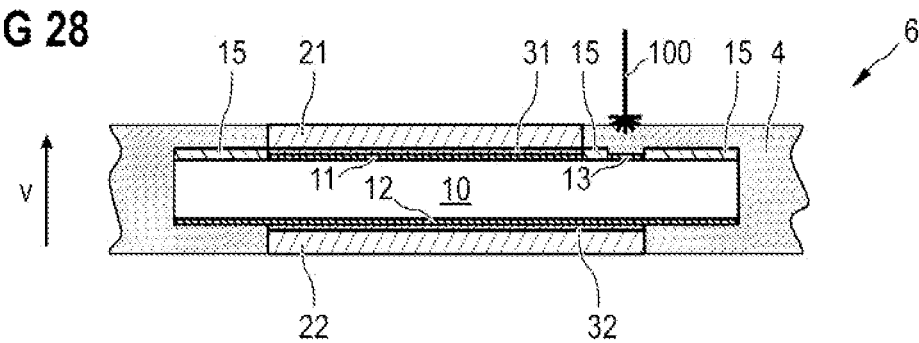
FIG. 28 shows the portion of the residual composite in accordance with FIG. 27 during the exposure of the control electrode by means of a laser beam.
Figure 29:
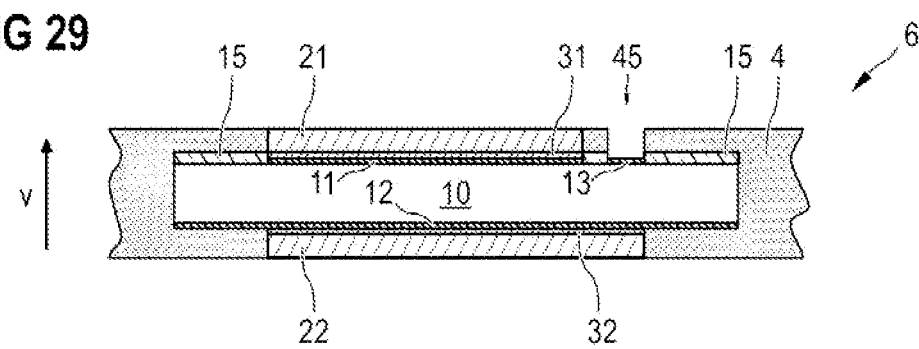
FIG. 29 shows the portion of the residual composite in accordance with FIGS. 27 and 28 after the exposure of the control electrode.
Figure 30:
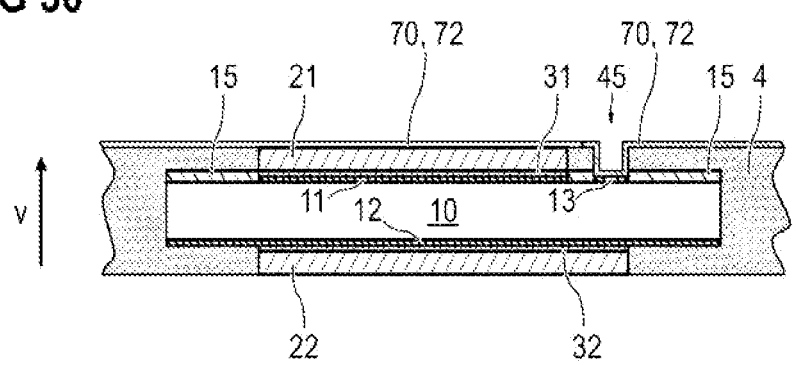
FIG. 30 shows the portion of the residual composite in accordance with FIG. 29 after a control electrode interconnection structure embodied as a metallization layer has been applied to the control electrode and to the embedding compound.
Figure 31:
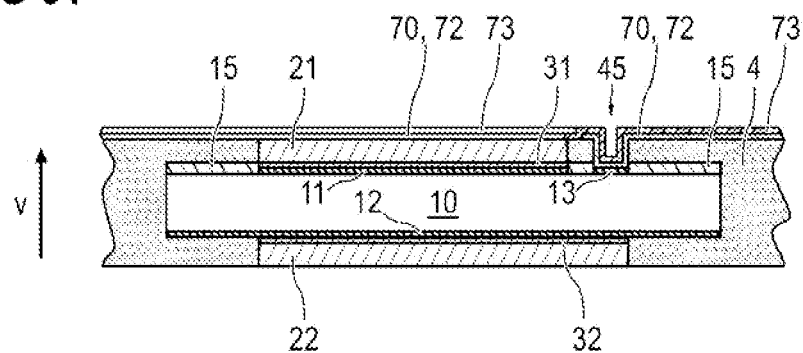
FIG. 31 shows the portion of the residual composite in accordance with FIG. 30 after a dielectric layer has been applied to the control electrode interconnection structure embodied as a metallization layer.

A further variant for realizing a control electrode interconnection structure 70 will now be explained with reference to FIGS. 27 to 31. FIG. 27 shows a residual composite 6 such as has already been explained with reference to FIG. 11, with the sole difference that no compensation pieces 23 were mounted on the control electrodes 13, such that the control electrodes 13 are covered by the embedding compound 4. For the rest, the arrangement in accordance with FIG. 27 can be produced in the same way as the arrangement in accordance with FIG. 11.

In order to be able to make electrical contact with the control electrodes 13, the control electrodes 13 covered by the embedding compound 4 are exposed. In principle, any desired techniques can be used for this purpose. One of these techniques consists in removing the embedding compound 4 above the control electrodes 13 by means of a laser beam 100 (see FIG. 28) to an extent such that the embedding compound 4 has cutouts 45, in the region of which the control electrodes 13 are in each case exposed, which is illustrated as the result in FIG. 29. As is furthermore shown in FIGS. 30 and 31, afterward it is possible to apply a conductor structure 72 (FIG. 30) and, to the latter, optionally, an arbitrary dielectric layer 73, for example a soldering resist. The conductor structure 72 and the dielectric layer 73 can be produced in the same way and have the same properties as the conductor structure 72 and dielectric layer 73 already explained with reference to FIGS. 17 and 18.

Figure 32:
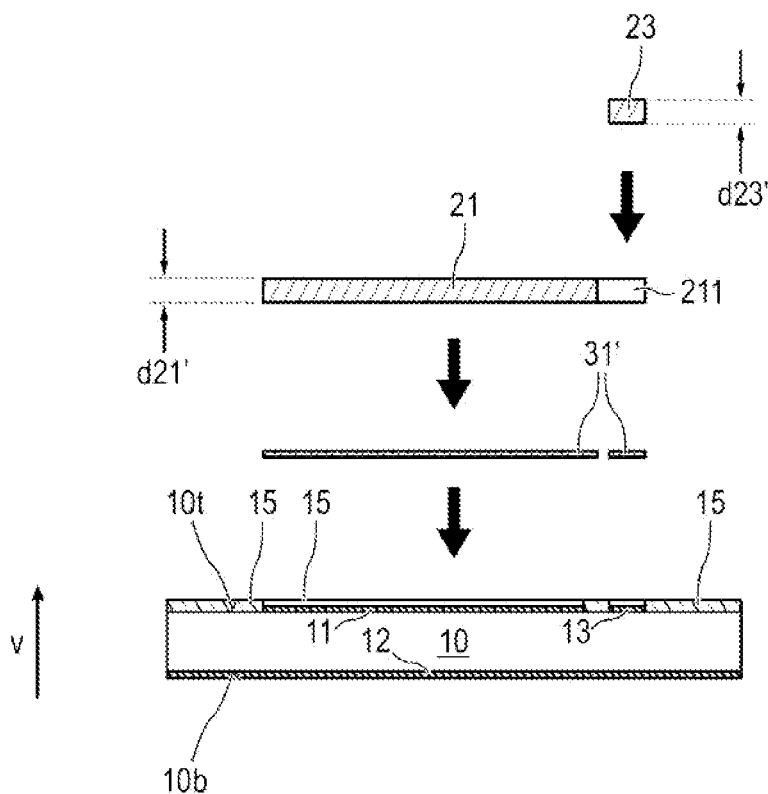
FIG. 32 shows a semiconductor chip with further parts for producing a chip assembly.
Figure 33:
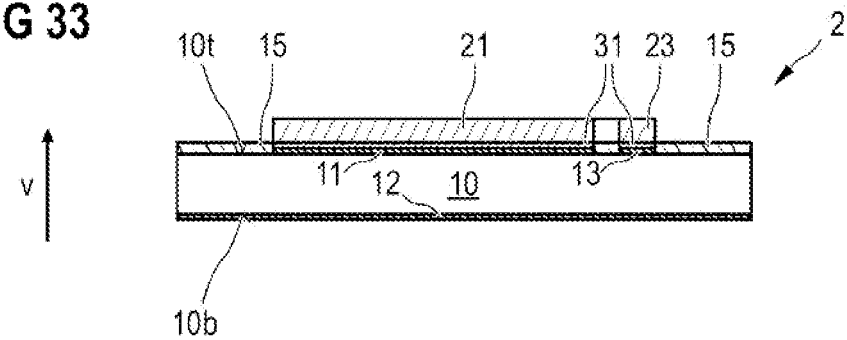
FIG. 33 shows the chip assembly produced from the semiconductor chip and the further parts in accordance with FIG. 32, which chip assembly differs from the chip assembly in accordance with FIG. 2 in that the chip assemblies do not each have a dedicated bottom compensation die, but rather a common compensation plate.

Yet another variant for producing a semiconductor arrangement will be explained with reference to FIGS. 32 to 36. FIG. 32 shows a semiconductor chip 1 with further parts for producing a chip assembly 2, as illustrated in FIG. 33. The semiconductor chip 1 can have the same construction as the semiconductor chip 1 in accordance with FIG. 1. In the same way as in the case of the chip assembly 2 in accordance with FIG. 2, an electrically conductive top compensation die 21 is situated on that side of the top main electrode 11 which faces away from the semiconductor body 10, and an optional contact piece 23 is situated on that side of the control electrode 13 which faces away from the semiconductor body 10. The top compensation die 21 and, if appropriate, the contact piece 23 are material bonded to the top main electrode 11 and to the control electrode, respectively, by means of a top connecting layer 31.

The top compensation die 21 and the optional contact piece 23 can consist of the same materials and have the same dimensions as the top compensation die 21 and the contact piece 23 in accordance with FIGS. 1 and 2. Moreover, the top connecting layer 31 can be produced with the same materials and in the same way as the top connecting layer 31 in accordance with FIGS. 1 and 2. The chip assembly 2 in accordance with FIG. 33 differs from the chip assembly 2 in accordance with FIG. 2 merely in that it has no bottom compensation die 22 and no bottom connecting layer 32.

Figure 34:
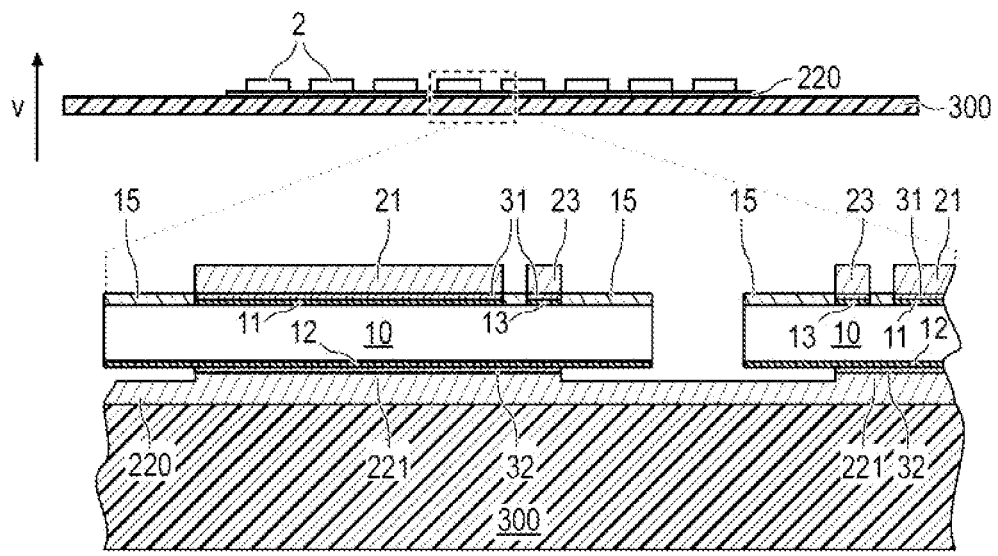
FIG. 34 shows a vertical section through a carrier, on which a plurality of chip assemblies embodied in accordance with FIG. 33 are arranged and which constitutes a compensation plate having a contact pedestal for making contact with each of the chip assemblies on the underside.

Two or more chip assemblies 2 as explained with reference to FIG. 33 can then be mounted on a common compensation plate 220. FIG. 34 shows one example of this. The mounting of the chip assemblies 2 on the electrically conductive compensation plate 220 is effected by means of a bottom connecting layer 32, which cohesively and electrically conductively connects each of the chip assemblies 2, at the bottom main electrode 12 thereof, to the compensation plate 220. The compensation plate 220 can consist of the same materials and have the same thickness d22 as the bottom compensation dies 22 in accordance with FIGS. 1 and 2. Moreover, the bottom connecting layer 32 can be produced with the same materials and in the same way as the bottom connecting layer 32 in accordance with FIGS. 1 and 2. In a departure from the illustration in accordance with FIG. 34, a separate carrier 300 can also be dispensed with, since the compensation plate 220 can concomitantly perform the function of the carrier 300.

As is likewise shown in FIG. 34, the compensation plate 220 can optionally have a separate contact pedestal 221 for each of the chip assemblies 2 for cohesive electrical connection to the compensation plate 220. In this case, the bottom connecting layer 32, for each of the chip assemblies 2, makes contact both with the bottom main electrode 12 thereof and with the associated contact pedestal 221.

Figure 35:
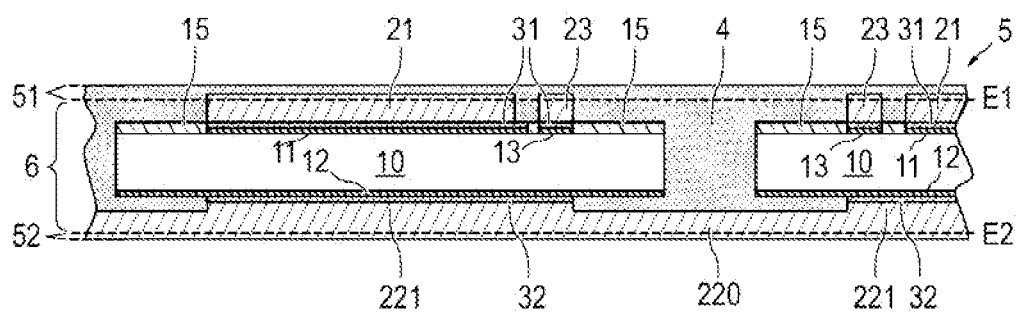
FIG. 35 shows the arrangement in accordance with FIG. 34 after the production of a composite by means of the embedding of the chip assemblies situated on the carrier into an embedding compound.

The arrangement with the chip assemblies 2 connected to the compensation plate 220 can optionally be arranged on a carrier 300 which can be embodied in the same way as the carrier 300 explained above. Independently of whether the chip assemblies 2 connected to the compensation plate 220 are arranged on a carrier 300, or whether the compensation plate 220 without an additional carrier 300 is used as a carrier for the chip assemblies 2, the chip assemblies 2 material bonded to the compensation plate 220 are embedded into an embedding compound 4, which is subsequently cured. In this case, the embedding compound 4 can be produced from the same materials and processed in the same way as already explained with reference to FIGS. 5 to 7, such that a composite 5 arises which—apart from the common compensation plate 220 instead of a plurality of individual compensation dies 22—is identical to the composite 5 in accordance with FIG. 8. FIG. 35 shows the composite 5 with the cured embedding compound 4 cohesively connecting the chip assemblies 2. As is evident from this configuration, a cohesive connection of the chip assemblies 2 need not be brought about solely by the embedding compound 4, rather it can optionally additionally be effected by the compensation plate 220 and the bottom connecting layer 32.

Figure 36:
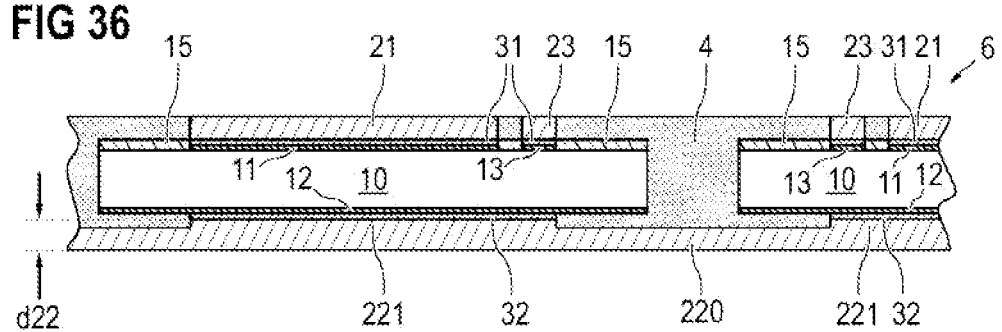
FIG. 36 shows the composite in accordance with FIG. 35 after the removal of a top cover layer and a bottom cover layer.

Then, as is illustrated as the result in FIG. 36, a top cover layer 51 of the composite 5 and/or a bottom cover layer 52 of the composite 5 can be removed from the composite 5, such that from the composite 5 a residual composite 6 remains, as has already been explained with reference to FIGS. 8 to 11. Here, too, the plane E1 indicates the interface between the top cover layer 51 and the residual composite 6, and the plane E2 indicates the interface between the bottom cover layer 52 and the residual composite 6, and the planes E1 and E2 preferably run parallel to one another.

In the case of the residual composite 6 shown here, the embedding compound 4 and the compensation plate 220 with the bottom connecting layer 32 have the effect that the chip assemblies 2 are fixedly and material bonded to one another. In this case, the embedding compound 4 can optionally bear directly against the semiconductor body 10 of each of the chip assemblies 2, that is to say against the semiconductor material thereof.

In so far as a top cover layer 51 is removed from the composite 5, in this case the cured embedding compound 4 is partly removed from the composite 5. Moreover, in each of the chip assemblies 2 the top compensation die 21 of the relevant chip assembly 2 is partly removed from the composite 5. In so far as, optionally, a bottom cover layer 52 is removed from the composite, in this case the compensation plate 220 is partly removed from the composite 5.

In any case, even after the removal of the top cover layer 51 and, if appropriate, the bottom cover layer 52, the embedding compound 4 ensures that the chip assemblies 2 are fixedly and material bonded to one another and together with the embedding compound 4, the compensation plate 220 and the bottom connecting layer 32 form a residual composite 6.

The removal of the top cover layer 51 and, if appropriate, the bottom cover layer 52 can be carried out in the same way and using the same techniques as already explained for the removal of the cover layers 51 and 52 in accordance with FIGS. 8 to 11. Afterward, an arbitrary control electrode interconnection structure 70 can be applied to the residual composite 6, as has already been explained above.

Figure 37:
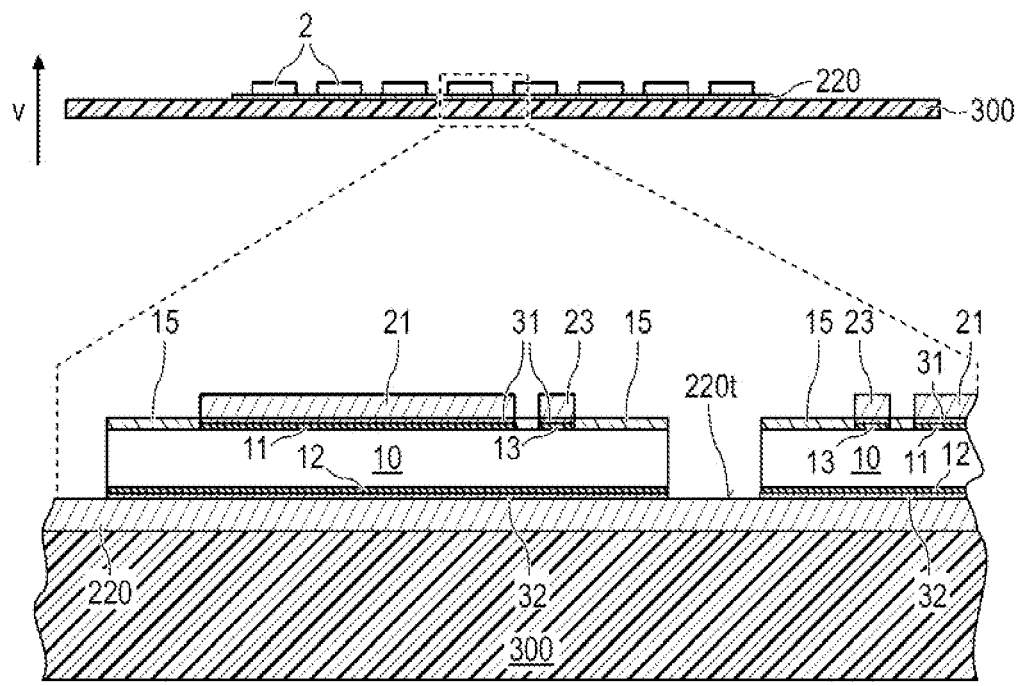
FIG. 37 shows an arrangement which differs from the arrangement in accordance with FIG. 34 in that the compensation plate has no contact pedestals.
Figure 38:
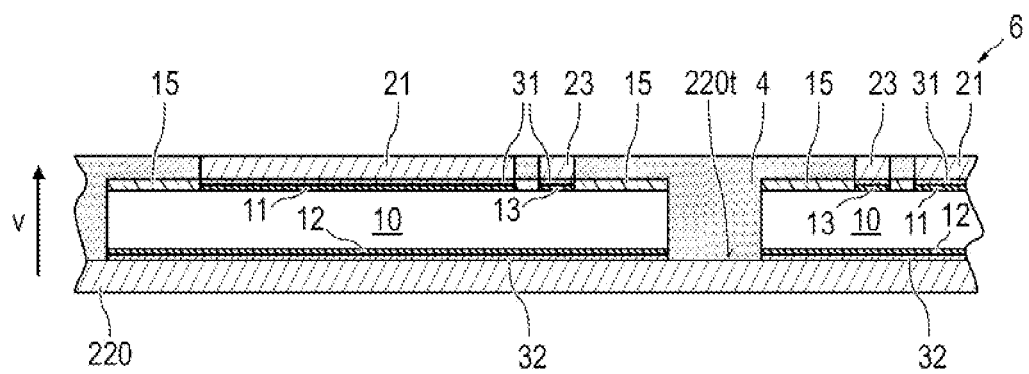
FIG. 38 shows the arrangement in accordance with FIG. 37 after the production of a composite by the embedding of the chip assemblies situated on the carrier into an embedding compound, and after the production of a residual composite by the removal of a top cover layer from the composite.

As a modification of the construction explained with reference to FIGS. 31 to 36, in the case of a contact plate 220 it is possible to dispense with contact bumps 221 for electrical and mechanical connection to the bottom main electrodes 22 of the chip assemblies 2. Instead, the chip assemblies 2 can be arranged on a planar surface portion 220t of the compensation plate 220 and at their bottom main electrodes 22 can be material bonded to the planar surface portion 220t by means of the bottom connecting layer 32, as is illustrated with reference to FIGS. 37 and 38. FIGS. 37 and 38 correspond to FIGS. 34 and 36, respectively, with the sole difference that the compensation plate 220 has a planar surface portion 220t instead of the contact bumps 221. Optionally, the entire side of the bottom compensation plate 220 facing the residual composite 6 can be planar in this case.

An explanation is given below, with reference to FIGS. 39 to 49, of the production of a semiconductor arrangement 7 in which, in the case of the top contact plate 41 and/or in the case of the bottom contact plate 42, the use of 411 and/or 422, respectively, for making electrical contact with the top compensation dies 21 and/or the bottom compensation dies 42, respectively, can be dispensed with. This results in the possibility that the sides of the top contact plate 41 and/or the bottom contact plate 42 which face the residual composite 6 are configured in a planar fashion. This is achieved by the embedding compound 4 being lowered relative to the top compensation dies 21 and/or relative to bottom compensation dies 42. This gives rise to an interspace between the embedding compound 4 and the relevant contact plate 41 and/or 42, in which interspace the control electrode interconnection structure 70 can be arranged.

Proceeding from the arrangement which is constructed in accordance with FIG. 27 and can be produced in the same way, the cured embedding compound 4 is lowered relative to the compensation dies 21 and/or relative to the bottom compensation dies 42. The lowering of the embedding compound 4 can be effected by etching, for example. For this purpose, the compensation dies 21 and/or 22 can be provided with an etching protection layer before the etching process and can thereby be protected against the etchant. Likewise, however, depending on the type of material of the embedding compound 4 and of the compensation dies 41 and/or 42, there is the possibility of using an etchant which substantially only etches the embedding compound 4, but does not etch the compensation dies 41 and/or 42, or etches them only to a small extent. The use of an etching protection layer can be dispensed with in this case.

Figure 39:
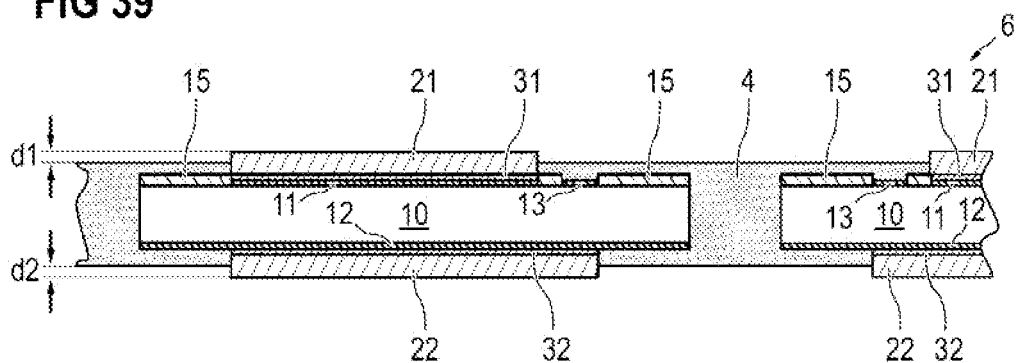
FIG. 39 shows the arrangement in accordance with FIG. 27 after the lowering of the embedding compound relative to the top and bottom compensation dies.

In any case, the embedding compound 4, as a result of the lowering, is lowered by d1 relative to the top compensation dies 21 and/or by d2 relative to the bottom compensation dies 22, which is readily apparent from a comparison of FIGS. 27 and 39. The lowering d1 and/or d2 can be approximately 50 µm, for example, although arbitrary values are possible in principle.

Figure 40:
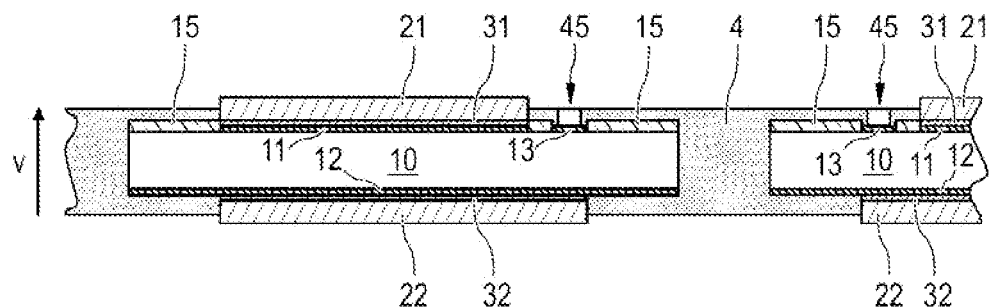
FIG. 40 shows the portion of the residual composite in accordance with FIG. 39 after the control electrode has been exposed.
Figure 41:
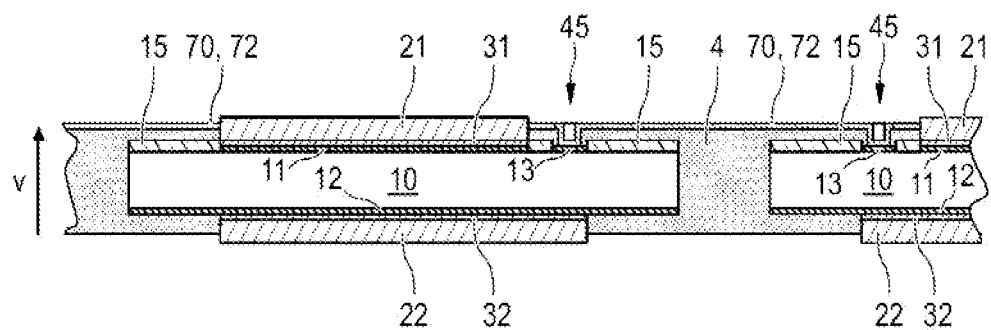
FIG. 41 shows the portion of the residual composite in accordance with FIG. 40 after a control electrode interconnection structure embodied as a metallization layer has been applied to the control electrode and to the embedding compound.
Figure 42:
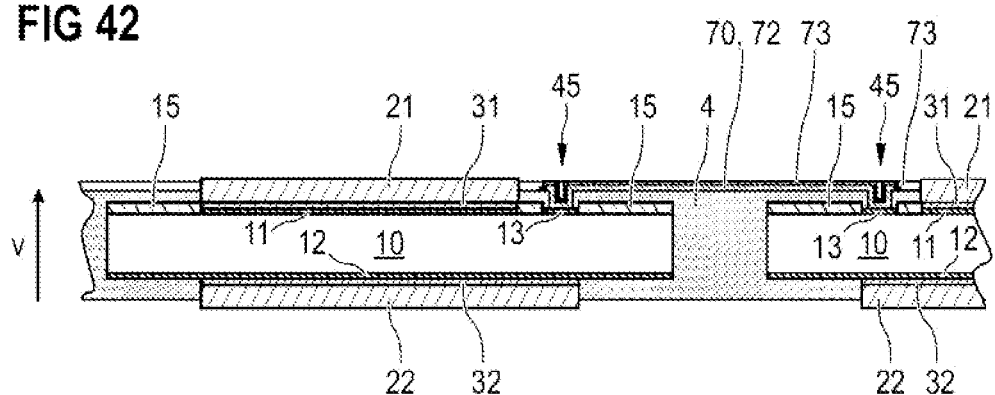
FIG. 42 shows the portion of the residual composite in accordance with FIG. 41 after a dielectric layer has been applied to the control electrode interconnection structure embodied as a metallization layer.

After the lowering, an arbitrary control electrode interconnection structure 70 such as has already been explained above can be applied to the residual composite 6 left and can be electrically connected to the control electrodes 13 of the chip assemblies 2. Merely as an example, FIGS. 40 to 42 show for this the application of a control electrode interconnection structure 70 in accordance with the method explained with reference to FIGS. 28 to 31. In order to be able to make electrical contact with the control electrodes 13, the control electrodes 13 which are covered by the embedding compound 4 are exposed, such that the embedding compound 4 has cutouts 45, in the region of which the control electrodes 13 are in each case completely or at least partly exposed, which is illustrated as the result in FIG. 40. Afterward, a conductor structure 72 (FIG. 41) is applied and a dielectric layer 73 (FIG. 42) is optionally applied thereto.

Afterward, the residual composite provided with the control electrode interconnection structure 70 can be arranged between the top contact plate 41 and the bottom contact plate 42 such that the top contact plate 41 makes electrical and optionally also mechanical contact with the top compensation dies 21 and the bottom contact plate 42 makes electrical and optionally also mechanical contact with the bottom compensation dies 22.

Figure 43:
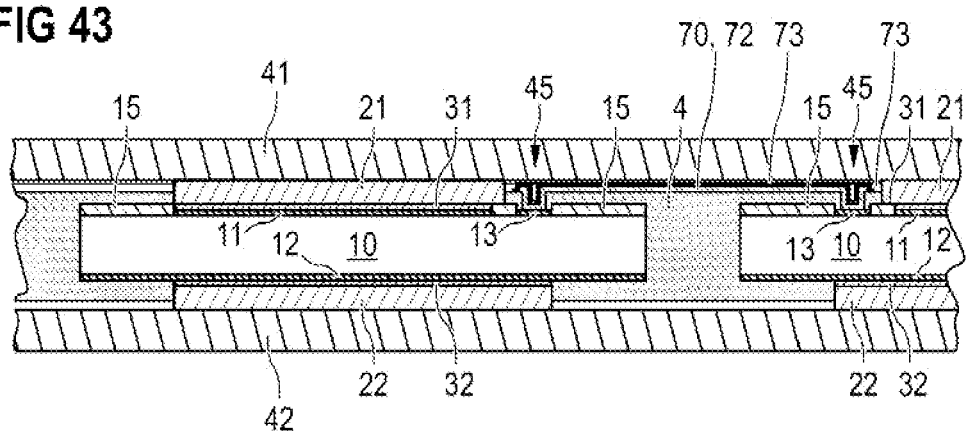
FIG. 43 shows the portion of the residual composite in accordance with FIG. 42 after the mounting of a top and a bottom contact plate.
Figure 44:
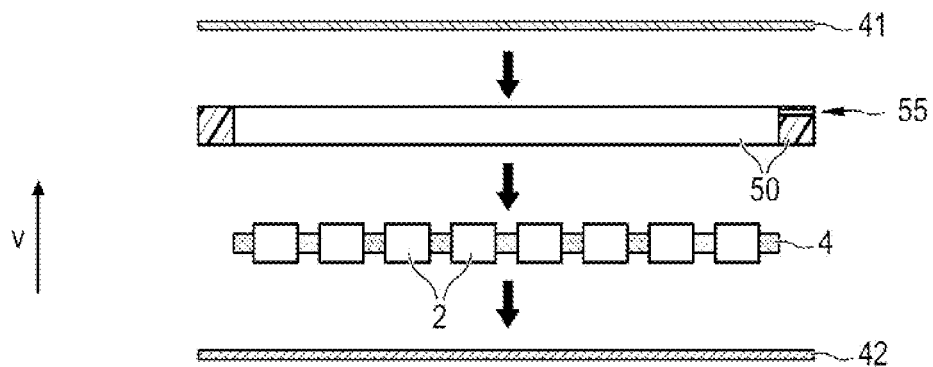
FIG. 44 shows a vertical section through an exploded illustration of the semiconductor arrangement in accordance with FIG. 43.
Figure 45:
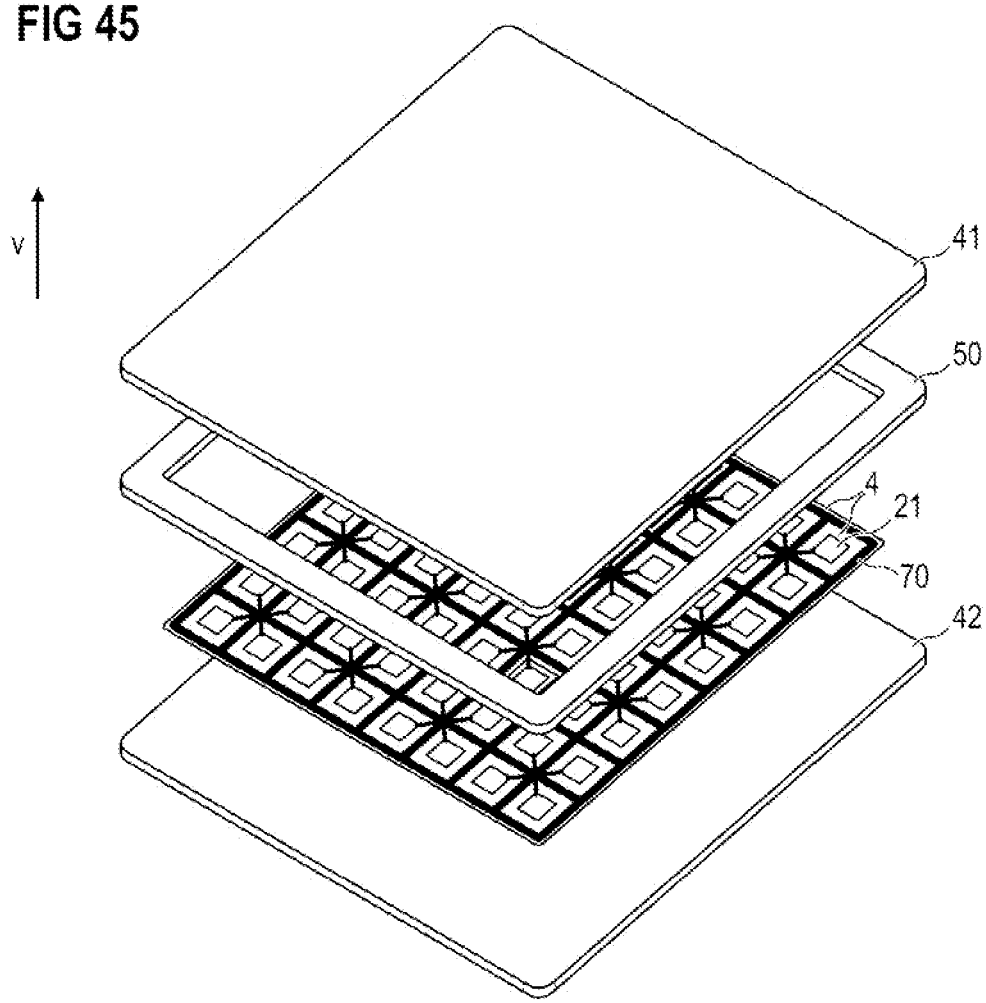
FIG. 45 shows a perspective exploded illustration of the semiconductor arrangement in accordance with FIG. 44.
Figure 46:
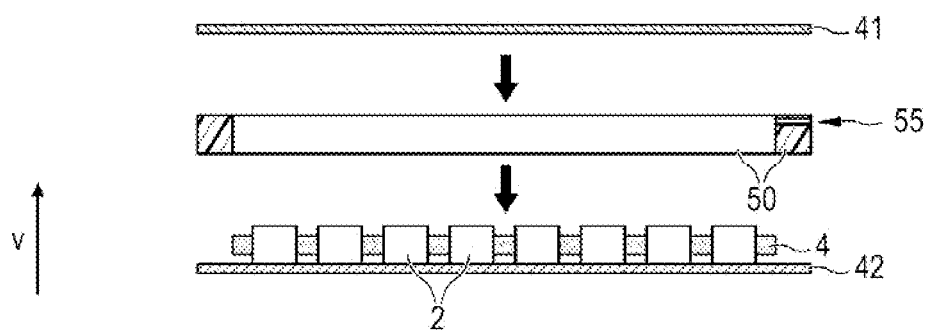
FIGS. 46-49 show different steps during the assembly of the semiconductor arrangement shown in FIG. 44.
Figure 47:
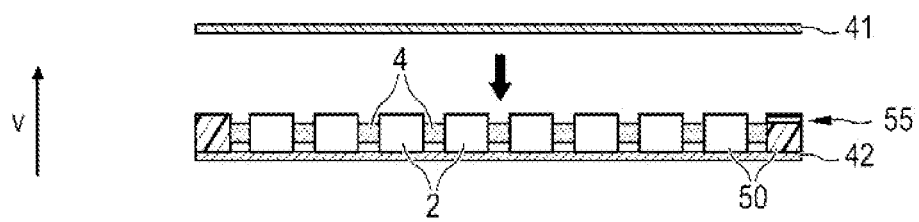
Figure 48:
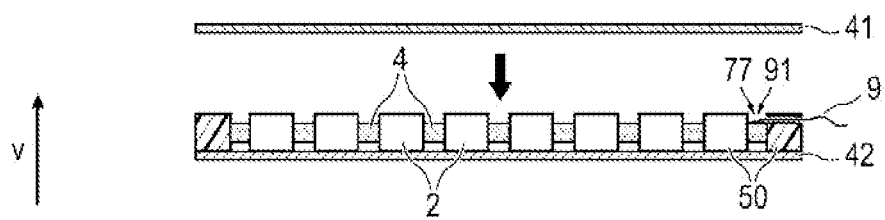
Figure 49:
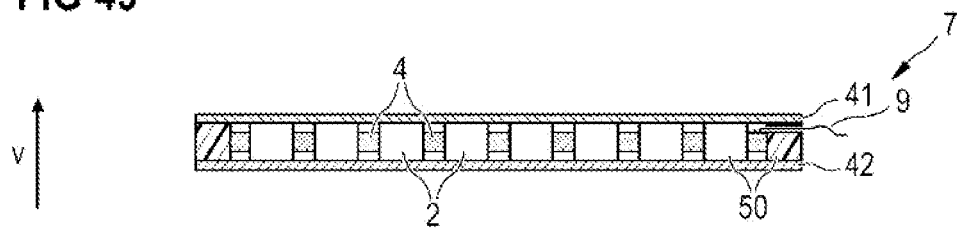

FIG. 44 shows a vertical section through an exploded illustration of the entire semiconductor arrangement in accordance with FIG. 43, wherein the control electrode interconnection structure 70 situated on the residual composite 6 is not illustrated. FIG. 45 shows a perspective view of this semiconductor arrangement, but with control electrode interconnection structure 70, and FIGS. 46 to 48 show different steps during the assembly of the finished semiconductor arrangement 7, illustrated in FIG. 49.

In order, in the case of semiconductor chips 1 having identical switching thresholds for switching on and/or off, to achieve simultaneous switching on and/or off, provision can be made for the nonreactive resistances of the conductor structure 72 between its terminal location 77 and the control electrode 13 of each of the semiconductor chips 1 to be identical. In the case of a homogeneous material or a homogeneous material structure of the conductor structure 72, this can be achieved the most simply by the conduction lengths of the conductor structure 72 in each case between its terminal location 77 and the control electrodes 13 being of equal length. Examples of this are shown in FIGS. 50 to 53.

Figure 50:
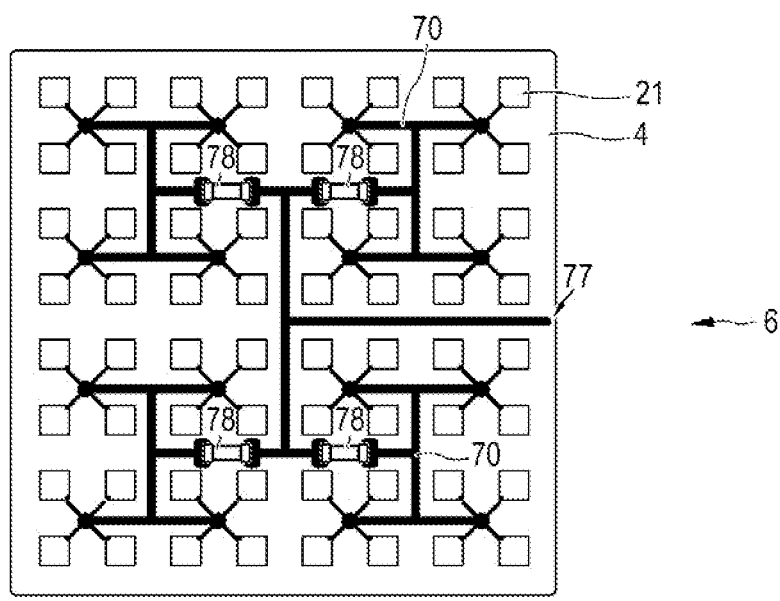
FIGS. 50-53 show different geometries of a control electrode interconnection structure for producing a semiconductor arrangement, with the control terminals of all the chip assemblies being connected to a common control terminal point of the chip assemblies by connecting lines of equal length.
Figure 51:
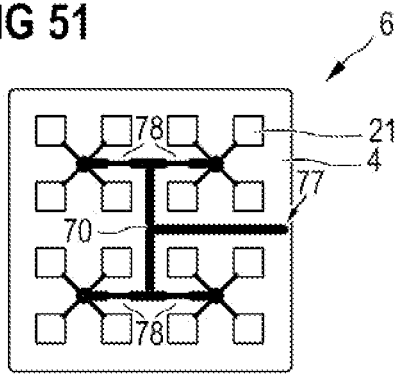
Figure 52:
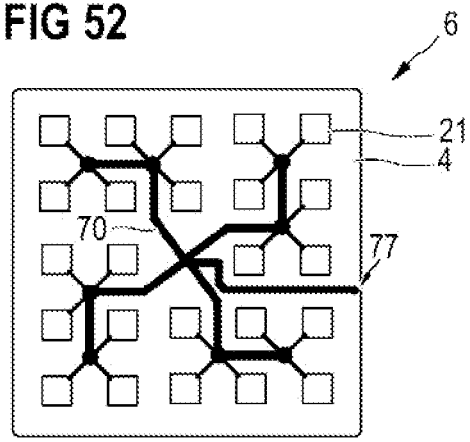
Figure 53:
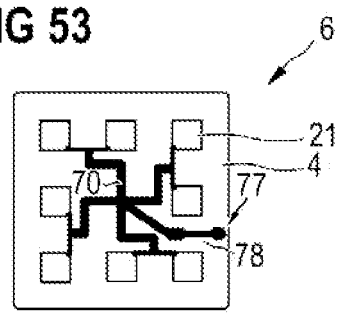

FIGS. 50, 51 and 53 show yet another configurational variant, in accordance with which the control electrode interconnection structure 70 can also have one or a plurality of passive components 78. The latter can be, for example, nonreactive resistors, but also any other passive components such as, for example, capacitors or inductances. An example of one or a plurality of integrated gate resistors 78 is illustrated in FIGS. 50, 51 and 53. Such a gate resistor 78 can in each case be connected upstream of only exactly one control electrode 13 or else, alternatively, a plurality or all of the control electrodes 13. Such a gate resistor can have, for example, a nonreactive resistance of at least 2 ohms.

As is illustrated in FIG. 50, a passive component 78 can be mounted on a conductor structure 72 of the control electrode interconnection structure 70, for example using SMT technology (surface mounting technology), or using thick-film technology. It is likewise possible, however, for a passive component 78 to constitute part of the conductor structure 72 of the control electrode interconnection structure 70, which is shown in FIGS. 51 and 53. The examples shown in each case involve nonreactive resistors 78 formed by a local cross-sectional narrowing of the conductor structure 72. The resistors 78 are disposed either upstream of each semiconductor chip 1, or upstream of a plurality of semiconductor chips 1 connected in parallel with one another. By way of example, the control electrodes 13 of two, three or four semiconductor chips 1 connected in parallel can be interconnected to the common terminal location 77 via a common gate resistor 78.

Figure 54:
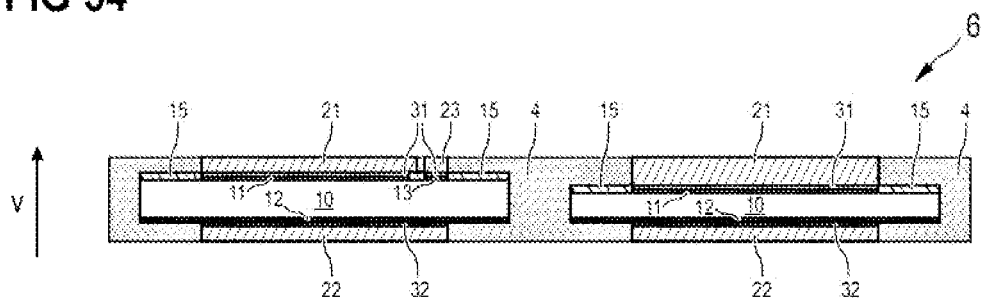
FIG. 54 shows a residual composite with two different semiconductor chips.

On the basis of the examples explained above, it has been found that a plurality or all of the semiconductor chips 1 of a semiconductor arrangement 7 can be identical. However, the present invention can also be used to employ different semiconductor chips 1 in a semiconductor arrangement 7 and to connect them to one another cohesively by means of the embedding compound 4. FIG. 54 shows one example of this. Two different semiconductor chips 1 are illustrated here, the semiconductor bodies 10 of which have different thicknesses. The different thicknesses of the semiconductor chips 1 can advantageously be compensated for by the use of top and/or bottom compensation dies 21 and/or 22 having different thicknesses. The semiconductor chip 1 on the left is a controllable semiconductor component, for example a MOSFET or an IGBT, and the semiconductor chip 1 on the right is a diode. In the case of the finished semiconductor arrangement 7 provided with a top and bottom contact plate 41 and 42, respectively, the diode can be embodied as a freewheeling diode, for example, which is electrically connected between the top main electrode 11 and the bottom main electrode 12 of the controllable semiconductor component.

Figure 55:
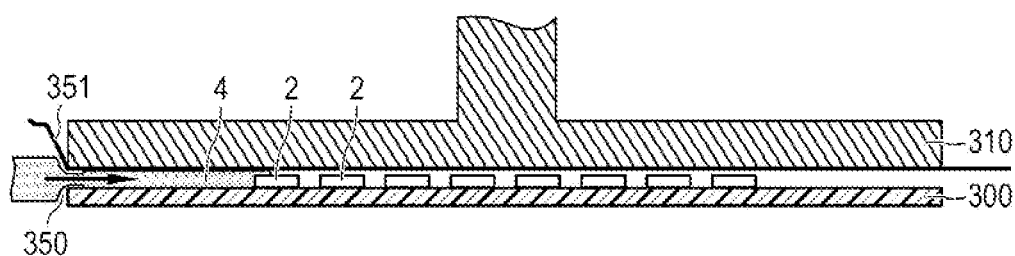
FIG. 55 shows a step of an alternative method for embedding a plurality of semiconductor arrangements into a common embedding compound, wherein the semiconductor arrangements are encapsulated with the embedding compound by injection molding.

With reference to FIGS. 4 to 6, an explanation was given above of a method by which a plurality of semiconductor arrangements 2 were embedded into a common embedding compound 4. An alternative method to this will now be explained with reference to FIGS. 55 and 56.

Firstly, as already described with reference to FIGS. 1 to 4, an arrangement is produced in which the chip assemblies 2 are arranged alongside one another on a common carrier 300 and/or 220, as is shown as the result in FIG. 4. Afterward, the stamp 310 is positioned above the chip assemblies 2 such that the chip assemblies 2 are arranged between mutually parallel surface portions of the carrier 300 and of the stamp 310. Moreover, a separating film 351 is positioned between the stamp 310 and the chip assemblies 2. With this arrangement being maintained, then, as is illustrated in FIG. 22, the embedding compound 4 is injected between the separating film 351 and the carrier 300 using an injection device 350 such that at least the interspaces situated between respectively adjacent chip assemblies 2 are filled with the embedding compound 4. The stamp 310 is protected against contact with the embedding compound 4 by means of the separating film 351.

Figure 56:
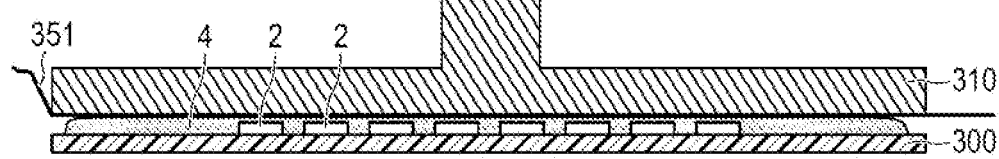
FIG. 56 shows the arrangement in accordance with FIG. 55 after the semiconductor arrangement has been encapsulated with the embedding compound by injection molding.

FIG. 56 shows the arrangement after the conclusion of the injection process and with the injection device 350 having been removed. After the curing of the embedding compound 4, the stamp 310, the separating film 351 and the carrier 300 can then be removed from the composite comprising the semiconductor arrangements 2 and the cured embedding compound 4. As a result, this leads to a composite such as has already been explained with reference to FIG. 8. This composite can consequently be processed further in the same way as the composite in accordance with FIG. 8.

Figure 57:
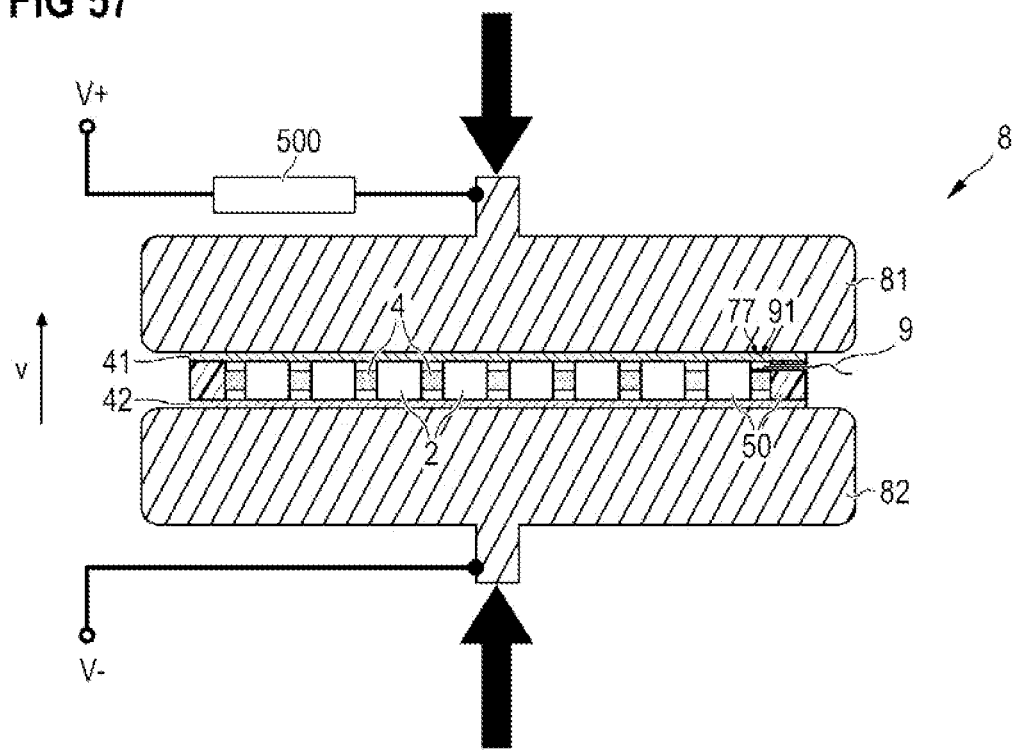
FIG. 57 shows a semiconductor arrangement clamped in between a top pressure contact piece and a bottom pressure contact piece and thereby subjected to pressure contact-connection.

A semiconductor arrangement 7 according to the present invention, as is shown by way of example in FIG. 57, can then be clamped in between an electrically conductive top pressure piece 81 and an electrically conductive bottom pressure piece 82 in such a way that there is in each case an electrical pressure contact-connection between the top pressure piece 81 and the top contact plate 41 and between the bottom pressure piece 82 and the bottom contact plate 42. The finished pressure contact arrangement 8 comprising the semiconductor arrangement 7, the top pressure piece 81 and the bottom pressure piece 82 can then be electrically interconnected. By way of example, the pressure contact arrangement 8 can be connected in series with a resistive and/or inductive load 500 between a positive supply potential V+ and a negative supply potential V−.

In the case of a semiconductor arrangement within the meaning of the present invention, an arbitrary number of mutually separate semiconductor bodies 100 can be fixedly connected to one another by the embedding compound 4. The number can be, for example, at least 9, at least 25 or at least 36.

What is claimed is:

1. A semiconductor arrangement, comprising:
   a top contact plate and a bottom contact plate;
   a plurality of chip assemblies, each of which has:
   a semiconductor chip having a semiconductor body, wherein the semiconductor body has a top side and an underside opposite the top side, and wherein the top side is spaced apart from the underside in a vertical direction;
   a top main electrode arranged on the top side;
   a bottom main electrode arranged on the underside;
   a control electrode, which is arranged at the top side and by means of which an electric current between the top main electrode and the bottom main electrode can be controlled; and
   an electrically conductive top compensation die, which is arranged on the side of the top main electrode facing away from the semiconductor body and is cohesively and electrically conductively connected to the top main electrode by means of a top connecting layer separate from the top compensation die;
   a dielectric embedding compound, by which the chip assemblies are material bonded to one another to form a solid composite, wherein in the case of each of the chip assemblies that side of the top compensation die of the relevant chip assembly which faces away from the semiconductor body is not or at least not completely covered by the embedding compound;

a control electrode interconnection structure, which is arranged on the solid composite and which electrically conductively connects the control electrodes of the chip assemblies to one another;

wherein:

each of the chip assemblies is arranged between the top contact plate and the bottom contact plate such that in the case of each chip assembly the side of the top compensation die facing away from the semiconductor body makes electrical contact with the top contact plate.

2. The semiconductor arrangement of claim 1, wherein:
(a) each of the chip assemblies has an electrically conductive bottom compensation die, which is arranged on the side of the bottom main electrode facing away from the semiconductor body and is cohesively and electrically conductively connected to the bottom main electrode by means of a bottom connecting layer separate from the bottom compensation die; or
(b) the chip assemblies have a common electrically conductive bottom compensation die, which in the case of each of the chip assemblies is arranged on the side of the bottom main electrode facing away from the semiconductor body and is cohesively and electrically conductively connected to the bottom main electrode by means of a bottom connecting layer separate from the bottom compensation die.

3. The semiconductor arrangement of claim 2, wherein the bottom connecting layer is embodied as a solder layer, or as an adhesive layer, or as a sintered layer.

4. The semiconductor arrangement of claim 2, wherein:
in case (a) the bottom compensation dies each have a coefficient of linear thermal expansion of less than 11 ppm/K; or
in case (b) the bottom compensation die has a coefficient of linear thermal expansion of less than 11 ppm/K.

5. The semiconductor arrangement of claim 2, wherein:
in case (a) the bottom compensation dies each have a thickness of at least 0.4 mm in the vertical direction; or
in case (b) the bottom compensation die has a thickness of at least 0.4 mm.

6. The semiconductor arrangement of claim 1, wherein: the top compensation dies each have a coefficient of linear thermal expansion of less than 11 ppm/K.

7. The semiconductor arrangement of claim 1, wherein the top connecting layer is embodied as a solder layer, or as an adhesive layer, or as a sintered layer.

8. The semiconductor arrangement of claim 1, further comprising a dielectric spacer ring, which is arranged between the top contact plate and the bottom contact plate and which surrounds the chip assemblies.

9. The semiconductor arrangement of claim 1, wherein the top contact plate has a contact pedestal on its side facing the bottom contact plate for each of the chip assemblies, the contact pedestal making electrical contact with the side of the top compensation die facing away from the semiconductor body.

10. The semiconductor arrangement of claim 9, wherein the top contact plate has a contact pedestal on its side facing the bottom contact plate for each of the chip assemblies, the contact pedestal making mechanical contact with the side of the top compensation die facing away from the semiconductor body.

11. The semiconductor arrangement of claim 1, wherein each of the chip assemblies has an electrically conductive contact piece, which is arranged between the control electrode of the relevant chip assembly and the control electrode interconnection structure and electrically conductively connects them to one another.

12. The semiconductor arrangement of claim 1, wherein the control electrode interconnection structure is arranged between the top contact plate and the solid composite.

13. The semiconductor arrangement of claim 1, wherein the control electrode interconnection structure is embodied as a printed circuit board, or as a structured metallization layer.

14. The semiconductor arrangement of claim 1, wherein the semiconductor bodies of directly adjacent chip assemblies have a spacing of at least 300 μm.

15. The semiconductor arrangement of claim 1, wherein in the case of each of the chip assemblies the top compensation die has a thickness of at least 0.4 mm in the vertical direction.

16. The semiconductor arrangement of claim 1, wherein the control electrode interconnection structure contains at least one passive component which:
is arranged on a conductor structure of the control electrode interconnection structure; and/or
constitutes a constituent part of the conductor structure of the control electrode interconnection structure.

17. The semiconductor arrangement of claim 1, wherein the control electrode interconnection structure has a conformally deposited conductor structure.

18. The semiconductor arrangement of claim 17, wherein the conformally deposited conductor structure has a thickness in the range of 30 μm to 70 μm.

19. A method for producing a semiconductor assembly, the method comprising:
providing a carrier;
providing a dielectric embedding compound;
providing a plurality of chip assemblies, each of which has:
a semiconductor chip having a semiconductor body, wherein the semiconductor body has a top side and an underside opposite the top side, and wherein the top side is spaced apart from the underside in a vertical direction;
a top main electrode arranged on the top side;
a bottom main electrode arranged on the underside;
a control electrode, which is arranged at the top side and by means of which an electric current between the top main electrode and the bottom main electrode can be controlled; and
an electrically conductive top compensation die, which is arranged on the side of the top main electrode facing away from the semiconductor body and is cohesively and electrically conductively connected to the top main electrode by means of a top connecting layer separate from the top compensation die; and
arranging the chip assemblies alongside one another on the carrier;
embedding the chip assemblies arranged on the carrier into the embedding compound and subsequently curing the embedding compound, such that the chip assemblies are fixedly connected to one another by the embedding compound and together with the embedding compound form a solid composite;
removing a top cover layer of the solid composite from the solid composite, such that:
from the solid composite a residual composite remains, wherein:

in the process of removing the top cover layer the cured embedding compound is partly removed from the solid composite;

in the process of removing the top cover layer in each of the chip assemblies the electrically conductive top compensation die of the relevant chip assemblies is partly removed from the solid composite;

the semiconductor chips and the top connecting layers of each of the chip assemblies remain in the residual composite;

in the residual composite in each of the chip assemblies the residue of the top compensation die remaining after the top cover layer has been removed is not or at least not completely covered by the embedding compound;

applying a control electrode interconnection structure to the residual composite in such a way that the control electrodes of the chip assemblies are electrically conductively connected to one another by the control electrode interconnection structure.

20. The method of claim 19, wherein:
the control electrode interconnection structure has a conductor track structure;
each of the chip assemblies provided has an electrically conductive contact piece, which is arranged on the side of the relevant control electrode facing away from the semiconductor body and is cohesively and electrically conductively connected to said control electrode;
applying a control electrode interconnection structure to the residual composite is carried out in such a way that in the case of each of the chip assemblies the contact piece is arranged between the control electrode of the relevant chip assembly and the conductor track structure and electrically conductively connects the contact piece to the conductor track structure.

21. The method of claim 20, wherein:
the conductor track structure is connected to a dielectric insulation carrier in a planar fashion and together with the carrier forms a printed circuit board which constitutes the control electrode interconnection structure; or
applying the control electrode interconnection structure to the residual composite is carried out by an electrically conductive layer applied on the residual composite in such a way that in the case of each of the chip assemblies, the electrically conductive layer makes electrically conductive contact with the side of the contact piece facing away from the semiconductor body.

22. The method of claim 19, wherein in the residual composite the cured embedding compound is lowered relative to the top compensation dies after the removal of the top cover layer.

23. The method of claim 19, wherein each of the chip assemblies provided has an electrically conductive bottom compensation die, which is arranged on the side of the bottom main electrode facing away from the semiconductor body and is material bonded and electrically conductively connected to said electrode by means of a bottom connecting layer separate from the bottom compensation die.

24. The method of claim 23, further comprising, before, together with or after the process of removing the top cover layer:
removing a bottom cover layer from the solid composite, wherein the cured embedding compound is partly removed from the solid composite and wherein in each of the chip assemblies the electrically conductive bottom compensation die of each of the relevant chip assemblies is partly removed from the solid composite, such that:
the semiconductor chips, the top connecting layers and the bottom connecting layers of each of the chip assemblies remain in the residual composite;
in the residual composite in each of the chip assemblies the residue of the bottom compensation die remaining after the bottom cover layer has been removed is not or at least not completely covered by the embedding compound.

25. The method of claim 19, wherein the carrier forms an electrically conductive compensation die and in the process of arranging the chip assemblies alongside one another on the carrier, in the case of each of the chip assemblies the side of the bottom main electrode facing away from the semiconductor body is material bonded and electrically conductively connected to the carrier.

26. The method of claim 19, wherein applying the control electrode interconnection structure to the residual composite comprises one of:
depositing an electrically conductive material on the residual composite;
placing a printed circuit board onto the residual composite; and
placing a leadframe onto the residual composite.

27. The method of claim 19, further comprising:
providing a top contact plate and a bottom contact plate;
arranging the semiconductor assembly between the top contact plate and the bottom contact plate such that in each of the chip assemblies:
the side of the top compensation die facing away from the semiconductor body makes electrical and mechanical contact with the top contact plate;
the side of the bottom compensation die facing away from the semiconductor body makes electrical and mechanical contact with the bottom contact plate.

28. A method, comprising:
providing a semiconductor arrangement, comprising:
a top contact plate and a bottom contact plate;
a plurality of chip assemblies, each of which has:
a semiconductor chip having a semiconductor body, wherein the semiconductor body has a top side and an underside opposite the top side, and wherein the top side is spaced apart from the underside in a vertical direction;
a top main electrode arranged on the top side;
a bottom main electrode arranged on the underside;
a control electrode, which is arranged at the top side and by means of which an electric current between the top main electrode and the bottom main electrode can be controlled; and
an electrically conductive top compensation die, which is arranged on the side of the top main electrode facing away from the semiconductor body and is cohesively and electrically conductively connected to the top main electrode by means of a top connecting layer separate from the top compensation die;
a dielectric embedding compound, by which the chip assemblies are material bonded to one another to form a solid composite, wherein in the case of each of the chip assemblies that side of the top compensation die of the relevant chip assembly which faces away from the semiconductor body is not or at least not completely covered by the embedding compound;

a control electrode interconnection structure, which is arranged on the solid composite and which electrically conductively connects the control electrodes of the chip assemblies to one another;
wherein:
each of the chip assemblies is arranged between the top contact plate and the bottom contact plate such that in the case of each chip assembly the side of the top compensation die facing away from the semiconductor body makes electrical contact with the top contact plate;
providing an electrically conductive top pressure contact piece and an electrically conductive bottom pressure contact piece;
clamping the semiconductor arrangement in between the top pressure contact piece and the bottom pressure contact piece such that there is a pure pressure contact between the top pressure contact piece and the top contact plate, and that there is a pure pressure contact between the bottom pressure contact piece and the bottom contact plate; and
connecting the top pressure contact piece and the bottom pressure contact piece to an electrical voltage source, such that different electrical potentials are present at the top pressure contact piece and the bottom pressure contact piece.

* * * * *